United States Patent
Nagai et al.

(10) Patent No.: US 7,799,515 B2
(45) Date of Patent: Sep. 21, 2010

(54) METHOD OF FABRICATING SEMICONDUCTOR DEVICE, AND DEVELOPING APPARATUS USING THE METHOD

(75) Inventors: Masaharu Nagai, Kanagawa (JP); Ichiro Uehara, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/016,244

(22) Filed: Jan. 18, 2008

(65) Prior Publication Data

US 2008/0182209 A1 Jul. 31, 2008

Related U.S. Application Data

(62) Division of application No. 10/405,908, filed on Apr. 3, 2003, now Pat. No. 7,344,825.

(30) Foreign Application Priority Data

Apr. 4, 2002 (JP) ............................. 2002-102178

(51) Int. Cl.
*G03F 7/26* (2006.01)

(52) U.S. Cl. .................. 430/328; 430/311; 430/330

(58) Field of Classification Search ................. 430/311, 430/328, 330
See application file for complete search history.

(56) References Cited

U.S. PATENT DOCUMENTS

| | | | |
|---|---|---|---|
| 4,646,424 A | 3/1987 | Parks | |
| 4,673,808 A | 6/1987 | Katohno | |
| 4,692,205 A | 9/1987 | Sachdev | |
| 4,816,115 A | 3/1989 | Hörner | |
| 5,129,991 A | 7/1992 | Gilton | |
| 5,470,693 A * | 11/1995 | Sachdev et al. | 430/315 |
| 5,506,168 A | 4/1996 | Morita | |
| 6,009,888 A | 1/2000 | Ye | |
| 6,057,081 A | 5/2000 | Yunogami | |
| 6,207,247 B1 | 3/2001 | Morita | |
| 6,285,433 B1 | 9/2001 | Kawasaki | |
| 6,306,559 B1 | 10/2001 | Tanamura | |
| 6,423,477 B1 | 7/2002 | Engelen | |
| 6,432,620 B1 | 8/2002 | Arao | |
| 6,461,886 B1 | 10/2002 | Uehara | |
| 6,497,992 B1 | 12/2002 | Yunogami | |
| 6,645,851 B1 | 11/2003 | Ho | |
| 6,730,458 B1 * | 5/2004 | Kim et al. | 430/296 |
| 6,746,965 B2 | 6/2004 | Uehara | |
| 2001/0052950 A1 | 12/2001 | Yamazaki | |
| 2002/0000551 A1 | 1/2002 | Yamazaki | |
| 2002/0127887 A1 | 9/2002 | Uehara | |
| 2003/0228740 A1 | 12/2003 | Nagai | |
| 2004/0091820 A1 | 5/2004 | Nagai | |
| 2004/0224514 A1 | 11/2004 | Uehara | |

FOREIGN PATENT DOCUMENTS

| | | |
|---|---|---|
| JP | 56-043639 | 4/1981 |
| JP | 63-220523 | 9/1988 |
| JP | 06-186755 | 7/1994 |
| JP | 11-045843 | 2/1999 |
| JP | 2002-033273 | 1/2002 |

OTHER PUBLICATIONS

Hatano et al., "A Novel Self-aligned Gate-overlapped LDD Poly-SI TFT with High Reliability and Performance", IEDM 97: Technical Digest of International Electron Devices Meeting, Dec. 7, 1997, pp. 523-526.

* cited by examiner

*Primary Examiner*—Kathleen Duda
(74) *Attorney, Agent, or Firm*—Fish & Richardson P.C.

(57) ABSTRACT

In a resist pattern forming method in which bake processing is performed at a temperature not lower than a glass transition temperature in order to obtain the desired sidewall angle, resist removable is difficult. Accordingly, in the resist pattern forming method of performing bake processing at a temperature not lower than a glass transition temperature, a process margin for resist removability cannot be ensured, so that there is the problem that it is impossible to compatibly realize both the formation of a resist pattern having the desired sidewall angle and the resist removability of the resist pattern. The invention aims to solve the problem. A resist pattern including a diazonaphthoquinone (DNQ)-novolac resin type of positive resist is formed, and the resist pattern is irradiated with light within the range of photosensitive wavelengths of a DNQ photosensitizer to perform bake processing on the resist pattern at a temperature not lower than the glass transition temperature of the resist pattern.

13 Claims, 16 Drawing Sheets

Fig. 1A applying a resist and prebake
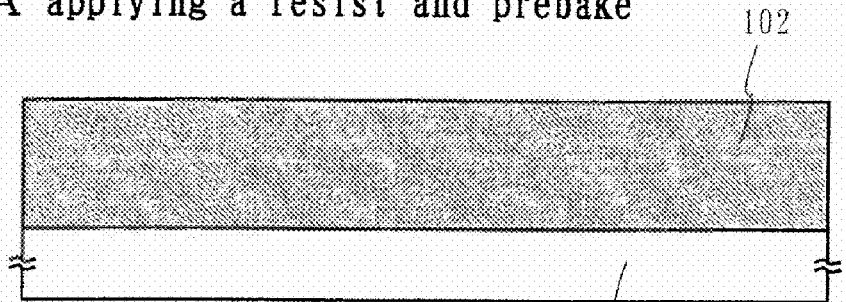
Fig. 1B exposure and developing
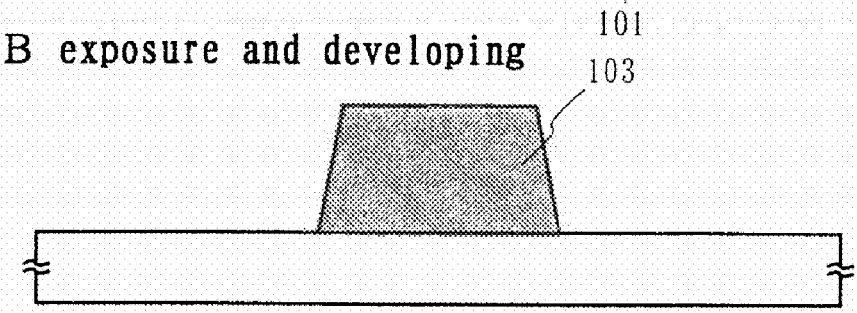
Fig. 1C light irradiation processing
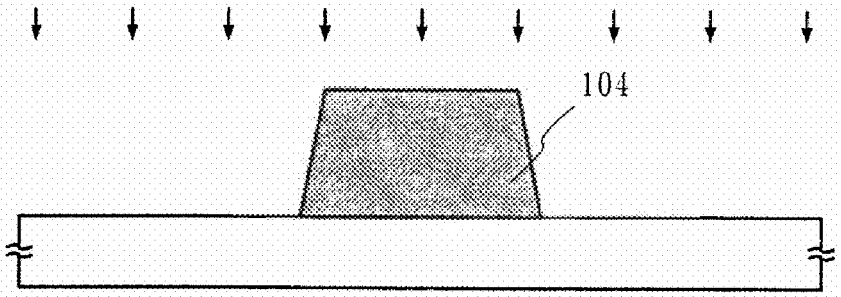
Fig. 1D bake processing at a temperature not lower than glass transition temperature
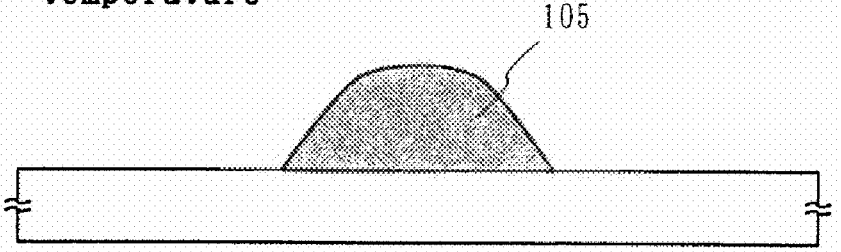

Fig. 2A
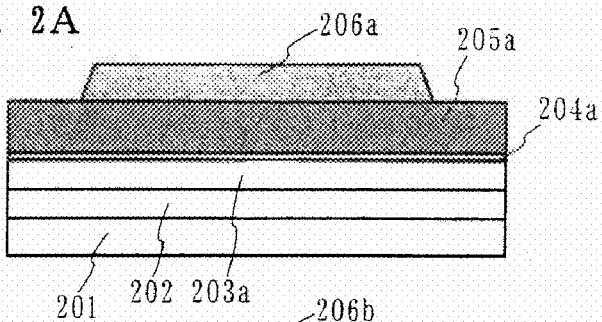

forming resist pattern (after exposure)

Fig. 2B
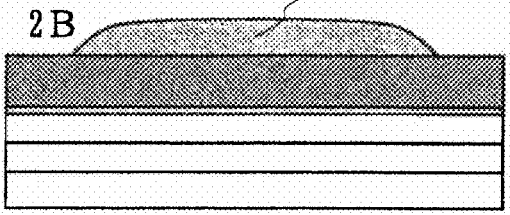

forming resist pattern (light irradiation and bake processing)

Fig. 2C
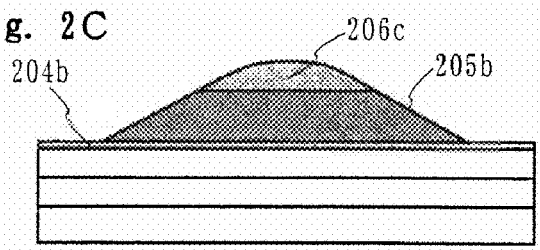

first step of etching only for second layer gate electrode film (continuous etching)

Fig. 2D
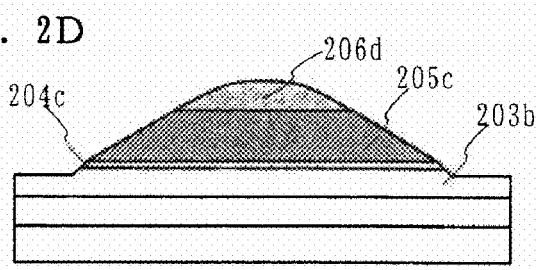

second step of etching only for first layer gate electrode film (continuous etching)

Fig. 2E
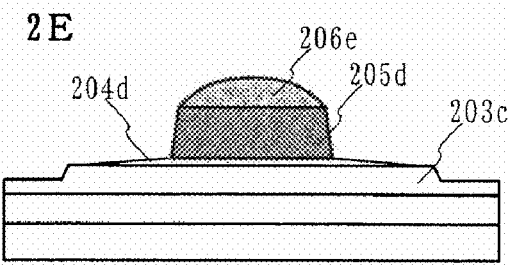

third step of etching only for second layer gate electrode film removing resist

Fig. 2F
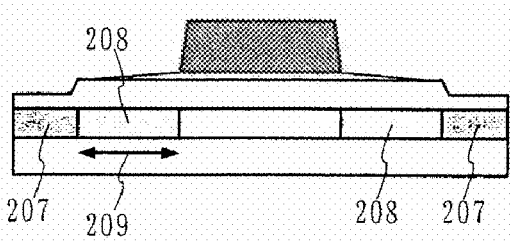

doping n-type impurity (forming n+ region and n− region)

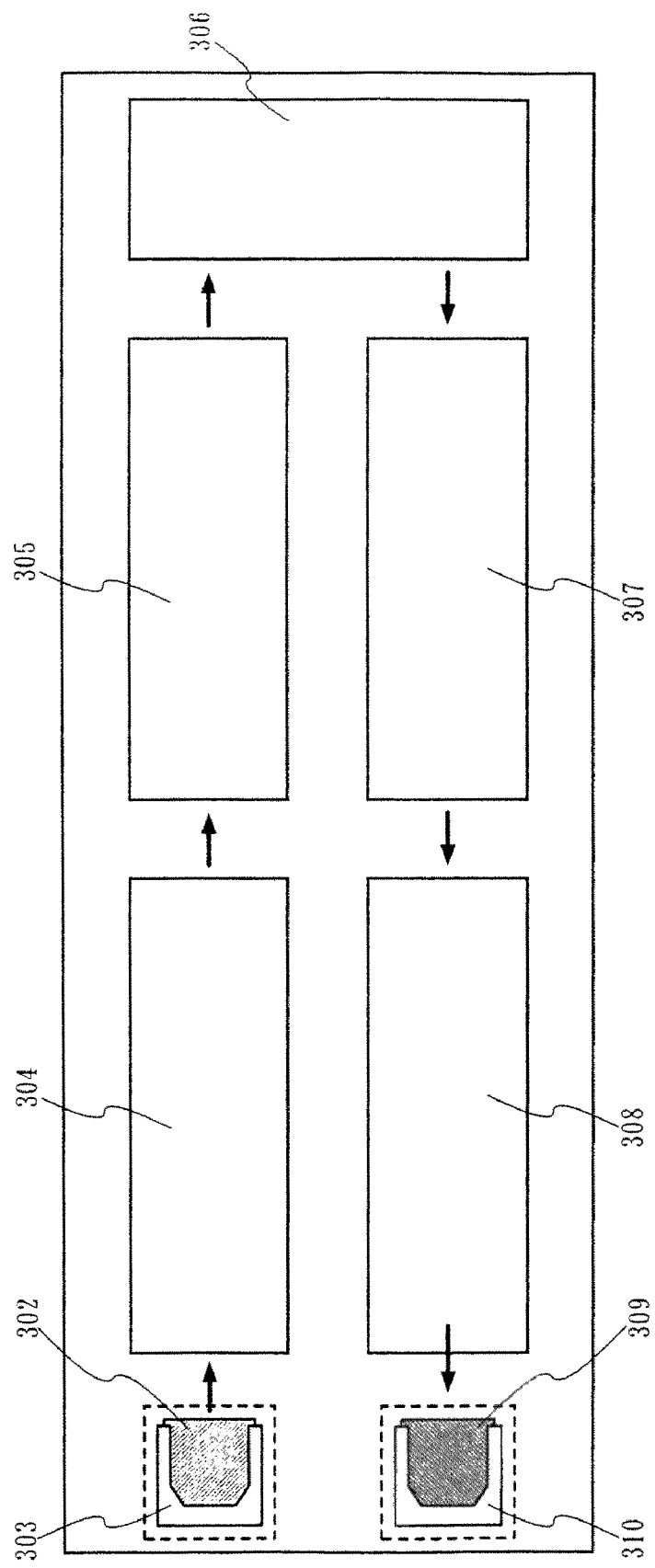

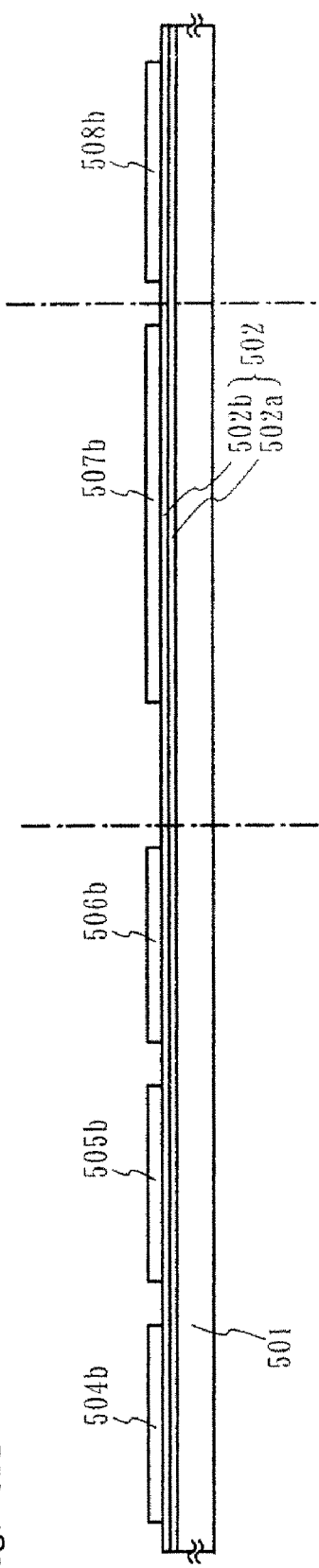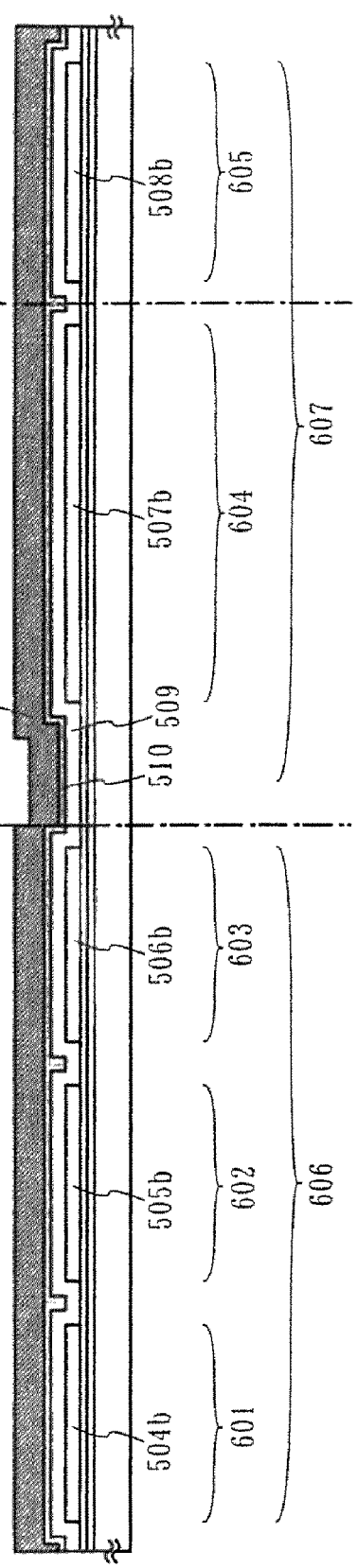

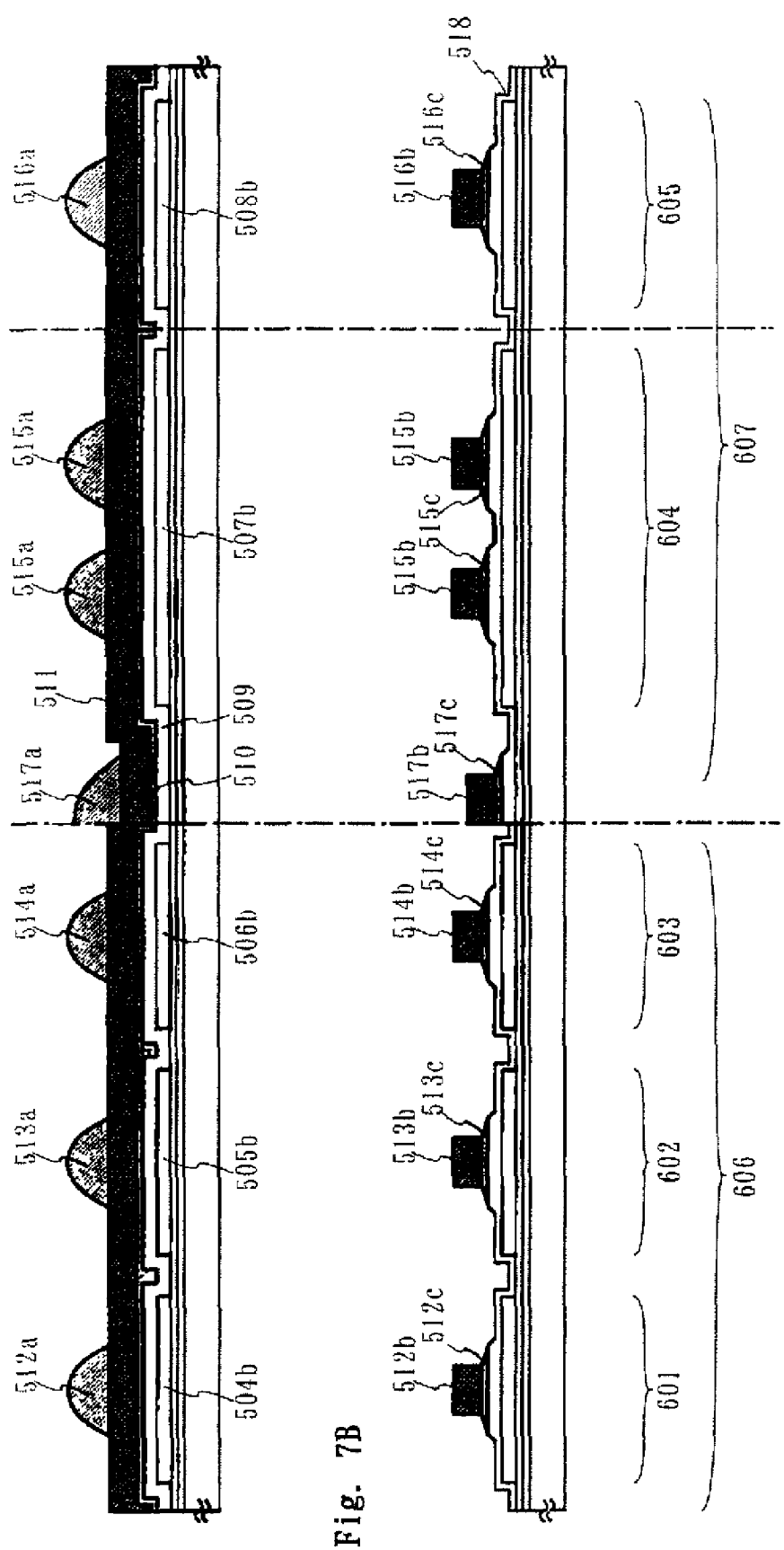

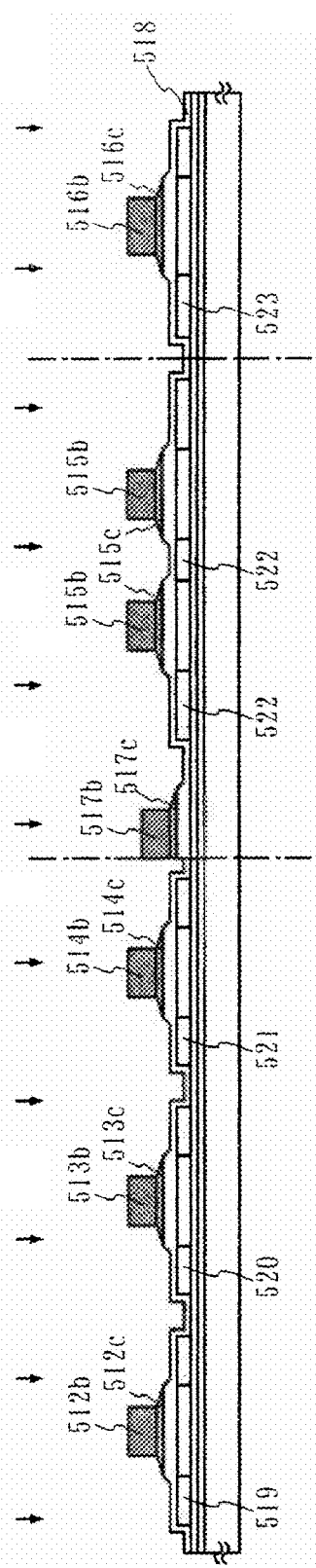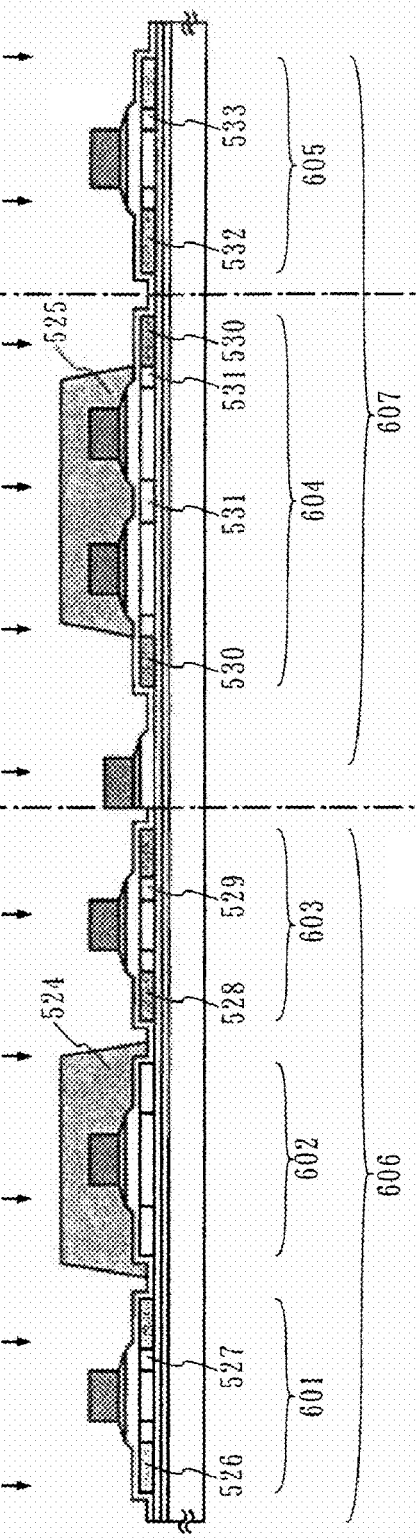

METHOD OF FABRICATING SEMICONDUCTOR DEVICE, AND DEVELOPING APPARATUS USING THE METHOD

BACKGROUND OF THE INVENTION

1. Field of the Invention

The present invention relates to a method of fabricating a semiconductor device and, more particularly, to a method of forming a resist pattern in a photolithography process. The invention further relates to a developing apparatus using the fabrication method. Incidentally, the term "semiconductor device" used herein generally represents a semiconductor device of the type which has a circuit construction made of thin film transistors (hereinafter abbreviated to TFTs), and display devices such as an active matrix type liquid crystal display device or an EL (abbreviation for Electroluminescence) display device are included in the category of the semiconductor device.

2. Description of the Related Art

In recent years, active matrix types of liquid crystal display devices having circuit constructions including TFTs are applied to the display screens of personal computers and television sets, and various products are in circulation in the market. In addition, active matrix type EL display devices of the self-luminous type which do not need backlights are considered to be advantageous for reductions in the thickness of display parts and reductions in production costs, and various manufacturers are conducting intensive research and development of associated products. In the fabrication of a display device such as an active matrix type of liquid crystal display device or EL display device, similarly to the case of an LSI (abbreviation for Large Scale Integrated Circuit) fabricating process, a thin film depositing step such as a CVD step, a photolithography step, an etching step and a resist removing step are repeatedly performed to form a fine device pattern. The photolithography step is the step of forming a resist pattern which becomes a base for the device pattern, the etching step is the device pattern forming step of performing etching processing on an underlying-layer film by using the resist pattern as a mask, and the resist removing step is the step of removing an unnecessary resist pattern after etching.

The above-described photolithography step is the step of forming a resist pattern which becomes a mask for etching, and in the process of fabricating the display device, a diazonaphthoquinone (hereinafter abbreviated to DNQ)-novolac resin type of positive resist is generally used as a resist material. An aligner for the photolithography step uses a 1:1 projection aligner (specifically, for example, MPA made by Canon) which uses multiple-wavelength light including G-line (436 nm), H-line (405 nm) and I-line (365 nm) which are spectral light of a super high pressure mercury lamp, or a 1:1 projection aligner using single-wavelength light abbreviated as a 1:1 stepper of G-line or I-line of a super high pressure mercury lamp. Specific processes of the photolithography step differ between the case where the 1:1 projection aligner of multiple-wavelength light is used and the case where the 1:1 projection aligner of single-wavelength light is used. The photolithography step in the case where the 1:1 projection aligner of multiple-wavelength light is used includes a series of steps: [resist coating]→[prebake (approximately at 100° C.)]→[exposure]→[development]→[postbake (approximately at 120° C.)]. The photolithography step in the case where the 1:1 projection aligner of single-wavelength light is used includes a series of steps: [resist coating]→[prebake (approximately at 100° C.)]→[exposure]→[bake after exposure (hereinafter abbreviated to PEB) (approximately at 120° C.)]→[development]→[postbake (approximately at 120° C.)], and is characterized in that the PEB processing is introduced after exposure.

Incidentally, in the case where the 1:1 projection aligner of single-wavelength light is used, the reason why the PEB processing is introduced after exposure is to prevent interference fringes unsuited to the formation of a fine pattern from being formed on the sidewall of a resist pattern. Namely, it is known that in the case where a resist pattern is exposed by the 1:1 projection aligner of single-wavelength light, owing to the single-wavelength of exposure light, the phenomenon that light intensity varies along the depth direction of a resist film occurs in the interior thereof in an exposed region as the result of the interference between light incident on a substrate and light reflected from the substrate. As a result, the variation phenomenon of light intensity incurs the phenomenon that the concentration of indene carboxylic acid (a photochemical reaction product from a DNQ photosensitizer) varies along the depth direction, and if the PEB processing is not performed after exposure, interference fringes are formed on the sidewall of a resist pattern. The PEB processing after exposure has the action of thermally diffusing the variations of the concentration of indene carboxylic acid that exist in the interior of the resist film in the exposed region, and uniformizing the concentration variations along the depth direction. Accordingly, the PEB processing can prevent the occurrence of interference fringes on the sidewall of the resist pattern after development. Some people skilled in the art have advanced the theory that the PEB processing after exposure is also effective on a standing-wave effect which is the phenomenon that the size of the resist pattern periodically varies with variations in the thickness of the resist film. For such reasons, in the case where the 1:1 projection aligner of single-wavelength light is used, the PEB processing is generally introduced after exposure. On the other hand, in the case where the 1:1 projection aligner of multiple-wavelength light is used, multiple-wavelength light (g-line, h-line and i-line of a super high pressure mercury lamp) is used as exposure light, and there hardly occurs the phenomenon that light intensity varies owing to the interference between light incident on a substrate and light reflected from the substrate. Accordingly, the PEB processing after exposure is basically unnecessary. However, since the introduction of the PEB processing does not cause a particular problem in terms of processes, the PEB processing may also be introduced.

In the formation of a fine pattern which is necessary for the fabrication of an LSI or the like, in terms of resolution, it is preferable that the shape of a resist pattern is generally close to a rectangle. On the other hand, in the case of fabrication of a display device, since the step of forming an etching pattern having a forwardly tapered shape is included, it is required to form a resist pattern having a small sidewall angle (sidewall angle: approximately 40-60 degrees) which disadvantageously affects resolution in the step of forming the etching pattern. The reason why the formation of a resist pattern having such a small sidewall angle is required is also influenced by the fact that the scaling of patterns in display devices presently has not advanced compared to LSIs and resolution is not very important. The formation of the resist pattern can be realized to some extent by a combination of an existing resist material of low resolution and an aligner, but according to the kind of taper etching step using a resist-receding method, it is necessary to form a taper portion of an etched pattern to elongate the size of the taper portion further more, so that it is necessary to form a resist pattern having a far smaller sidewall angle (for example, not greater than 50 degrees). As one example of the method of decreasing the sidewall angle of a resist pattern, there is a method of performing bake processing at a temperature not lower than glass transition point, but it is known that removing of resist patterns become more difficult along with raising of bake temperature.

The resist removing step for removing an unnecessary resist pattern will be described below. A resist pattern formed in the photolithography step serves as a mask for dry etching processing or wet etching processing, and after the completion of etching processing, it is necessary to remove an unnecessary resist pattern. For this reason, resist removing processing which includes an ashing step and a resist removing step is performed for the purpose of removing such an unnecessary resist pattern. The ashing step is the step of decomposing a resist pattern into carbon dioxide by means of oxygen plasma, and is a vapor-phase resist removing step. The resist removing step is the step of dipping a substrate after ashing processing into an organic resist removing solution adjusted to a predetermined temperature (approximately 60-90° C.) and dissolving and removing a resist pattern by using the dissolution action of the resist removing solution, and is a liquid-phase resist removing step.

In the resist removing step including the ashing step and the resist removing step, it is known that a resist pattern after dry etching processing becomes difficult to remove. When a resist pattern on a substrate passes through a dry etching step, the reaction of polymers which constitute a resist with an etching gas and the crosslinking reaction of the polymers proceed, and a deteriorated layer difficult to remove is produced on the surface of the resist pattern. The deteriorated layer has resistance to ashing and tends to prolong the time of ashing processing, and the speed of ashing is improved by adding a predetermined ratio of hydrogen or nitrogen to oxygen which is an ashing gas. Otherwise, the speed of ashing is also improved by adding a halogen gas such as $CF_4$ to oxygen which is an ashing gas, but since there is the problem that a base substrate is etch-damaged in terms of the selectivity of the resist pattern to the base substrate, the ashing step is applied to a limited process.

In addition, in the resist removing step after the ashing step, resist removing capability is required to be improved, as by using a resist removing solution having a strong removing capability. However, it is known that a resist removing solution having a strong resist removing capability has a harmful effect of causing etch damage to the active layers of TFTs formed of a silicon-based semiconductor film, and a further improvement of the performance of the resist removing solution is desired. Incidentally, the problem of etch damage caused to the silicon-based semiconductor film by the resist removing solution is a phenomenon which occurs when the resist removing solution which exhibits strong alkaline as the result of the hygroscopic action of the resist removing solution comes into direct contact with the silicon-based semiconductor film, and various measures are being investigated from the viewpoints of both an improvement of the resist removing solution and a process improvement (such as a protective film is deposited on the surface of the silicon-based semiconductor film).

SUMMARY OF THE INVENTION

In a dry etching step, there is a case where a taper etching method using a resist-receding phenomenon during dry etching is used. In the dry etching step, there is a case where it is required to form a resist pattern having a small sidewall angle so that the taper portion of an etched pattern is elongated further more. A representative example of this taper etching step is that of the GOLD (abbreviation for Gate Overlapped LDD)-structure TFT shown in FIG. 11A. In FIG. 11A, reference numeral 701 denotes a glass substrate which is a transparent, electrically insulative substrate, reference numeral 702 denotes a semiconductor layer including a silicon-based semiconductor film, which is the active layer of a TFT. A heavily doped impurity region ($n^+$ or $p^+$ region) 705 of one conductivity type which functions as a source region or a drain region and a lightly doped impurity region ($n^-$ or $p^-$ region) 706 of the same conductivity type which functions as a electric field relaxation region are formed in the semiconductor layer 702. A gate electrode 704 includes a first-layer gate electrode 704a which is small in film thickness and has a large size in the channel direction and a second-layer gate electrode 704b which is large in film thickness and has a small size in the channel direction, and the lightly doped impurity region ($n^-$ or $p^-$ region) 706 which is a field relaxation region is formed to overlap the first-layer gate electrode 704a, and is herein called a Lov region 707. Incidentally, the field relaxation region of a LDD (abbreviation for Lightly Doped Drain)-structure TFT which is formed so as not to overlap a gate electrode is herein called a Loff region.

In the step of forming the gate electrodes of the GOLD-structure TFT having the above-described structure, the size of the Lov region 707 which overlaps the first-layer gate electrode 704a needs to be controlled in relation to TFT characteristics, and from the result of intensive examination, it has been found out that the control of the size of the Lov region 707 can be realized by controlling the sidewall angle of a resist pattern which serves as a mask during dry etching. This fact is apparent from the result shown in FIG. 11B that is correlation data representative the correlation between the sidewall angle of a resist pattern and the size of a Lov region. Incidentally, when the correlation data shown in FIG. 11B is to be acquired, the sidewall angle of the resist pattern is varied by performing bake processing at a temperature not lower than the glass transition temperature of the resist pattern, but the sidewall angle becomes rounded and the sidewall angle of the resist pattern becomes difficult to measure accurately. Accordingly, the profile between a sidewall portion corresponding to a height of 1 μm from the bottom of the resist pattern and the end portion of the resist pattern is linearly approximated, and the angle formed by the obtained approximate straight line and a base substrate is defined as the sidewall angle of the resist pattern, and the correlation data shown in FIG. 11B is acquired from the sidewall angle of the resist pattern defined in this manner.

In this manner, the sidewall angle of a resist pattern can be made smaller by performing bake processing on the resist pattern at a temperature not lower than the glass transition temperature of the resist pattern, but when a desired sidewall angle not greater than, for example, 50 degrees is to be obtained, bake temperature needs to be raised considerably (for example, approximately 200° C.). It is known, however, that an increase in bake temperature leads to the problem that resist removal becomes difficult. It has been experientially discovered that when bake processing on the resist pattern is performed at a temperature not lower than 170° C., the speed of ashing, although it depends on the kind of resist material, becomes slower and resist removability extremely deteriorate particularly in the resist removing step. Accordingly, in the case of the resist pattern forming method of baking a resist pattern at a temperature not lower than the glass transition temperature of the resist pattern for the purpose of obtaining the desired sidewall angle (for example, not greater than 50 degrees) of the resist pattern, the problem that a process margin for resist removability cannot be ensured becomes apparent, with the result that it becomes difficult to compatibly realize both the formation of a resist pattern having the desired sidewall angle and the resist removability of the resist pattern.

The invention has been made to solve the above-described problems, and an object of the invention is to provide a semiconductor layer fabricating method capable of compatibly realizing the formation of a resist pattern having a desired sidewall angle and the resist removability of the resist pattern, as well as a developing apparatus for use in the fabricating method.

The invention has been made on the basis of the following chief experimental results. The chief experimental results will be described below.

Experiment 1

A resist pattern including a DNQ-novolac resin type of positive resist was formed on a glass substrate through a series of steps: [resist coating]→[prebake (approximately at 100° C.)]→[exposure]→[development]→[postbake (approximately at 120° C.)], and a particular region of the resist pattern was observed with an optical microscope. After that, twelve minutes of bake processing at 200° C. and resist removing processing were performed, and after the completion of each of the processings, the state of the resist pattern was observed with the optical microscope. FIG. 12 is optical-microscope photographic data showing the states of the resist pattern obtained through this experimental method. The following facts were found from the result shown in FIG. 12. The first finding is that in the observed region of the resist pattern after the postbake, i.e., a region irradiated with light from a microscope light source, the resist pattern after the twelve minutes of bake processing at 200° C. is abnormally softened compared to an unobserved region. The second finding is that in the observed region of the resist pattern after the postbake, i.e., the region irradiated with light from the microscope light source, the resist pattern is nearly completely removed through the resist removing process compared to the unobserved region. In the region observed with the optical microscope, it is considered that the resist pattern after the postbake is exposed by light from the light source of the optical microscope, so that a nonreacting DNQ photosensitizer which exists in the interior of the resist pattern is also exposed. This fact is presumed to be the cause of the two findings. Incidentally, the chief experimental conditions of Experiment 1 are shown in Table 1 (refer to FIG. 12).

TABLE 1

| ITEMS | PROCESS CONDITIONS |
| --- | --- |
| Resist | TFR-H PL 19 cp (Made by Tokyo Ohka Kogyo Co., Ltd.) |
| Prebake | 100° C. - 90 sec |
| Resist Film Thickness | 1.5 μm |
| Exposure | MPA-600 SUPER Exposure Time = 17 sec |
| Development | NMD-3 (TMAH: 2.38%) Developing Time = 45 sec |
| Postbake | 120° C. - 120 sec |
| Light Irradiation Processing | Observation with Optical Microscope (approximately 20 sec) |

Experiment 2

Although in the above-described Experiment 1, the light source of the optical microscope was used for the exposure of the resist pattern after the postbake, in Experiment 2, exposure processing was performed on a resist pattern after postbake with an actual exposure apparatus and an experiment was performed for verifying whether a similar result could be obtained as to resist softening characteristics. Specifically, resist patterns including a DNQ-novolac resin type of positive resist were respectively formed on eight glass substrates through a series of steps: [resist coating]→[prebake (approximately at 100° C.)]→[exposure]→[development]→[postbake (approximately at 120° C.)], and the entire surfaces of four of the eight glass substrates were subjected to exposure processing (exposure time=17 seconds) with a 1:1 projection aligner (specifically, for example, MPA made by Canon) which uses multiple-wavelength light including G-line (436 nm), H-line (405 nm) and I-line (365 nm). After that, the exposed substrates and the unexposed substrates were respectively baked under the bake conditions of 120° C.-12 min, 140° C.-12 min, 160° C.-12 min and 200° C.-12 min. Then, the cross sections of the respective resist patterns after the bake processing were observed with a scanning electron microscope (abbreviated to SEM). The result is shown in FIG. 13, and it has been confirmed that in the case where exposure processing is performed on the resist patterns after the postbake, the softening of the resist patterns starts at lower bake temperatures than those in the case where exposure processing is not performed on the resist patterns after the postbake. From this fact, it is apparent that the exposure processing of a resist pattern after postbake has the action of lowering the glass transition temperature of the resist pattern. Incidentally, the chief experimental conditions of Experiment 2 are shown in Table 2 (refer to FIG. 13).

TABLE 2

| ITEMS | PROCESS CONDITIONS |
| --- | --- |
| Resist | TFR-H PL 19 cp (Made by Tokyo Ohka Kogyo Co., Ltd.) |
| Prebake | 100° C. - 90 sec |
| Resist Film Thickness | 1.5 μm |
| Exposure | MPA-600 SUPER Exposure Time = 17 sec |
| Development | NMD-3 (TMAH: 2.38%) Developing Time = 45 sec |
| Postbake | 120° C. - 120 sec |
| Light Irradiation Processing | MPA-600 SUPER Exposure Time = 17 sec (Processed Substrates: Four of Eight Substrates) |
| Bake Processing | 120° C., 140° C., 160° C., 200° C. - 12 sec (Bake Processing: Processed in Bake Oven) |

Experiment 3

In Experiment 3, evaluation was made as to the resist removability of a resist pattern after postbake with respect to variations in the exposure time of exposure processing of the resist pattern. Specifically, resist patterns including a DNQ-novolac resin type of positive resist were respectively formed on six glass substrates through a series of steps: [resist coating]→[prebake (approximately at 100° C.)]→[exposure]→[development]→[postbake (approximately at 120° C.)], and the respective substrates were exposed with different exposure times of 0 sec (nonexposure), 10 sec, 17 sec, 30 sec, 60 sec and 180 sec. After that, resist removing processing was performed on each of the substrates, and influences on the resist removabilities of the respective resist patterns were examined. Incidentally, the chief experimental conditions of Experiment 3 are shown in Table 3. The result of Experiment 3 is shown in Table 4, and it has been confirmed that in the case of nonexposure (exposure time=0 sec), resist removal cannot at all be effected even if three minutes of resist removing processing is performed, whereas in the case where exposure processing of not shorter than 17 sec is performed, resist removal can be effected with 1.5 minutes of resist removing processing. From this fact, it is apparent that the exposure processing of a resist pattern after postbake has the action of improving the resist removability of the resist pattern (refer to Table 4).

TABLE 3

| ITEMS | PROCESS CONDITIONS |
|---|---|
| Resist | TFR-H PL 19 cp (Made by Tokyo Ohka Kogyo Co., Ltd.) |
| Prebake | 100° C. - 90 sec |
| Resist Film Thickness | 1.5 μm |
| Exposure | MPA-600 SUPER Exposure Time = 17 sec |
| Development | NMD-3 (TMAH: 2.38%) Developing Time = 45 sec |
| Postbake | 120° C. - 120 sec |
| Light Irradiation Processing | MPA-600 SUPER Exposure Time = 0, 10, 17, 30, 60, 180 sec |
| Bake Processing | 150° C. - 12 min (Bake Processing: Processed in Bake Oven) |
| Resist Removing | Resist Removing Solution: SS-1 (Made by Sumitomo Chemical Co., Ltd.) 60° C. - 1.5 min (Only Unexposed Substrate: 3 min) |

TABLE 4

| EXPOSURE TIME AFTER FORMATION OF PATTERN | RESIST REMOVING TIME | EVALUATION OF REMOVABILITY |
|---|---|---|
| 0 sec (Unexposed) | 3.0 min | X |
| 10 sec | 1.5 min | Δ |
| 17 sec | 1.5 min | ○ |
| 30 sec | 1.5 min | ○ |
| 60 sec | 1.5 min | ○ |
| 180 sec | 1.5 min | ○ |

Note)
○: No resist residues,
Δ: Slight resist residues,
X: Resist remaining.

On the basis of the results of the above-described basic experiments, one aspect of the invention provides a method of fabricating a semiconductor layer, and another aspect of the invention provides a developing apparatus for use in the method. Chief aspects of the invention will be described below.

According to one aspect of the invention, after a resist pattern including a positive resist containing a photosensitizer is formed on an object to be processed, the resist pattern is irradiated with light within a range of photosensitive wavelengths of a DNQ photosensitizer, and baking the resist pattern at a temperature not lower than a glass transition temperature of the positive resist containing the photosensitizer.

According to another aspect of the invention, after a resist pattern comprising a positive resist containing a photosensitizer is formed on an object to be processed, the resist pattern is irradiated with light within a range of photosensitive wavelengths of a DNQ photosensitizer, then baking the resist pattern at a temperature not lower than a glass transition temperature of the positive resist containing the photosensitizer, and subsequently dry etching processing using the resist pattern as a mask is performed.

According to another aspect of the invention, after a resist pattern including a positive resist containing a photosensitizer is formed on an object to be processed, the resist pattern is irradiated with light within a range of photosensitive wavelengths of a DNQ photosensitizer, then baking the resist pattern at a temperature not lower than a glass transition temperature of the positive resist containing the photosensitizer, then dry etching processing using the resist pattern as a mask is performed, and subsequently removing processing is performed on the resist pattern.

In the above-described aspects of the invention, end portion of the object to be processed is formed into a tapered shape by the dry etching processing.

In the above-described aspects of the invention, the photosensitizer is diazonaphthoquinone.

In the above-described aspects of the invention, the positive resist containing the photosensitizer is a diazonaphthoquinone-novolac resin type of resist, and the photosensitizer is diazonaphthoquinone.

In the above-described aspects of the invention, the category of usable substrates includes not only a glass or quartz substrate having a flat surface on which a semiconductor device is to be fabricated, but also a glass or quartz substrate having a curved fabrication surface, and further includes a film-like plastic substrate.

In the above-described aspects of the invention, the DNQ-novolac resin type of positive resist is a general-purpose positive resist of the type which is generally used in the process of fabricating a semiconductor device, and a g-line type resist and an i-line type resist are commercially available according to the wavelength of exposure light. In the invention, any DNQ-novolac resin type of positive resist can be used, and either of the G-line type resist and the I-line type resist may be used. Furthermore, the invention can be used with any type of resist that contains a positive photosensitizer. In the formation of the positive resist into a pattern, a 1:1 projection aligner (specifically, for example, MPA made by Canon) which uses multiple-wavelength light (g-line, h-line and i-line) which is spectral light of a super high pressure mercury lamp, or a 1:1 projection aligner using single-wavelength light of g-line or i-line (abbreviated to a 1:1 stepper) are applicable. A resist pattern forming step in which the 1:1 projection aligner of multiple-wavelength light is used includes a series of steps: [resist coating]→[prebake (approximately at 100° C.)]→[exposure]→[PEB (approximately at 120° C.): introducible]→[development]. Incidentally, in the resist pattern forming step using mutiple-wavelength light, the PEB processing is generally unnecessary, but since the introduction of the PEB processing does not cause a particular problem in terms of processes, the PEB processing is labeled "introducible". A resist pattern forming step in which the 1:1 projection aligner of single-wavelength light is used includes a series of steps: [resist coating]→[prebake (approximately 100° C.)]→[exposure]→ [PEB (approximately 120° C.)]→[development], and is characterized in that the PEB processing after exposure is indispensable.

In the above-described aspects of the invention, the light within the range of photosensitive wavelengths of the DNQ photosensitizer is generally light of wavelengths 350 nm to 450 nm according to the kind of DNQ photosensitizer. Then, suitable examples of the light of wavelengths 350 nm to 450 nm are g-line (436 nm), h-line (405 nm) and i-line (365 nm) which are spectral lights of a super high pressure mercury lamp, and a single or plural ones of the lines of the spectral light may be used. In the case where plural ones of the lines of the spectral lights are used, multiple-wavelength light including two or more wavelengths selected from among g-line (436 nm), h-line (405 nm) and i-line (365 nm) of the super high pressure mercury lamp is irradiated onto a resist pattern after development (a resist pattern before bake processing at a temperature not lower than the glass transition temperature). On the other hand, in the case where a single one of the lines of the spectral light is used, single-wavelength light including g-line (436 nm) or h-line (405 nm) or i-line (365 nm) of the super high pressure mercury lamp is irradiated onto a resist pattern after development. Incidentally, since the multiple-wavelength light is larger than the single-wavelength light in terms of the amount of light irradiation, the multiple-wavelength light can expose the DNQ photosensitizer in the interior of a resist pattern within a shorter irradiation time, and is, therefore, more preferable in terms of a reduction in irradiation time. The light irradiation step may be processed with an independent dedicated apparatus having a light irradiation unit, or the light irradiation step and a developing step may also be continuously processed with a dedicated developing apparatus having a built-in light irradiation unit.

In the above-described aspects of the invention, the bake processing needs to be performed at a temperature not lower than the glass transition temperature of a resist pattern for the purpose of softening and fluidizing the resist pattern. During this bake processing, the developed resist pattern is irradiated with light within the range of photosensitive wavelengths of the DNQ photosensitizer, so that a large amount of indene carboxylic acid which is a photoreaction product from the DNQ photosensitizer is produced in the interior of the resist pattern. The large amount of indene carboxylic acid produced in the interior of the resist pattern is considered to have the action of lowering the glass transition temperature of the resist pattern. Accordingly, when the resist pattern is to be baked at a temperature not lower than the glass transition temperature, it is possible to realize a decrease in a bake temperature for obtaining the desired sidewall angle of the resist pattern. In the case where the bake temperature is not decreased, the sidewall angle of the resist pattern can be made smaller (for example, not greater than 50 degrees) owing to the promotion of softening and fluidization. In addition, as the temperature of bake processing is raised, the sidewall angle of the resist pattern can be smaller by softening and fluidization. It is, therefore, necessary that the relationship between the sidewall angle of the resist pattern and the bake temperature be found in advance and the resist pattern be baked at a bake temperature for forming the resist pattern having the desired sidewall angle. Incidentally, in the case where the resist pattern is baked at a temperature not lower than the glass transition temperature, the sidewall angle becomes rounded, so that the sidewall angle of the resist pattern becomes difficult to measure accurately. Accordingly, the profile between a sidewall portion corresponding to a height of 1 μm from the bottom of the resist pattern and the end portion of the resist pattern is linearly approximated, and the angle formed by the obtained approximate straight line and the base substrate is defined as the sidewall angle of the resist pattern.

In the above-described aspects of the invention, in the dry etching processing, an RIE type of dry etching apparatus or a high-density plasma type of dry etching apparatus capable of independently controlling high-density plasma and bias voltage to be applied to a substrate, and a so-called taper etching processing by resist-receding method is performed. The taper etching processing based on the resist-receding method, for example, is an etching method which performs dry etching processing with the deteriorated selectivity between a resist pattern and a base film by adding oxygen or the like to an etching gas, and is characterized in that the sidewall of an etched pattern can be formed into a forwardly tapered shape since the taper etching processing performs etching processing on the base film while receding the edge portion of the resist pattern by corroding the resist pattern. As compared with general resist patterns, the sidewall angle of the resist pattern according to the invention can be made small to a further extent owing to the promotion of softening and fluidization due to bake processing. Accordingly, in the taper etching step based on the resist-receding method, a taper portion can be formed to have a far longer size.

In the above-described aspects of the invention, the resist removing processing is the processing of removing an unnecessary resist pattern after the completion of the dry etching processing, and generally includes an ashing step and a resist removing step. The ashing step is the step of decomposing a resist pattern into carbon dioxide by means of oxygen plasma and is a vapor-phase resist removing step. The resist removing step is the step of dipping a substrate into an organic resist removing solution adjusted to a predetermined temperature (approximately 60-90° C.) and dissolving and removing a resist pattern by using the dissolution action of the resist removing solution after ashing processing, and is a liquid-phase resist removing step. In a resist pattern after dry etching processing, since the reaction of polymers which constitute a resist with an etching gas and the cross-linking reaction of the polymers proceed, a deteriorated layer difficult to remove is produced on the surface of the resist pattern. Accordingly, the ashing step is applied to the removal of the deteriorated layer, while the resist removing step is applied to the removal of a resist pattern after the removal of the deteriorated layer. Incidentally, in the resist pattern according to the invention, a large amount of indene carboxylic acid which is a photochemical reaction product from the DNQ photosensitizer is produced in the interior of the resist pattern by the irradiation of a developed resist pattern with light within the range of photosensitive wavelengths of the DNQ photosensitizer. The production of the indene carboxylic acid is considered to have the action of promoting the solubility in the resist removing solution of a resist material which is left when the deteriorated layer is removed from the surface portion of the resist pattern by ashing after the dry etching processing. Accordingly, it is possible to completely remove the resist pattern after the dry etching processing without leaving resist residues, through the ashing step and the resist removing step.

According to the invention constructed in the above-described manner, the irradiation of a developed resist pattern with light of wavelength 350-450 nm which is light within the range of photosensitive wavelengths of a DNQ photosensitizer is considered to provide the action of lowering the glass transition temperature of the resist pattern and the action of promoting the solubility in a resist removing solution of the resist pattern except the surface portion of the resist pattern after dry etching processing (i.e., a deteriorated layer portion formed during dry etching). Accordingly, when a resist pattern is to be baked at a temperature not lower than the glass transition temperature of the resist pattern, it is possible to realize a decrease in a bake temperature for obtaining the desired sidewall angle of the resist pattern. In the case where the bake temperature is not decreased, the sidewall angle of the resist pattern can be smaller owing to the promotion of softening and fluidization. This fact means that in a taper etching process based on a resist-receding method, a taper portion can be formed to have a far longer size. In addition, in the processing of removing a resist pattern after dry etching processing, it is possible to completely remove the resist pattern without leaving resist residues, through an ashing step and a resist removing step. Therefore, the semiconductor device fabricating method to which the invention is applied is extremely advantageous for improving the process margin of the taper etching step based on the resist-receding method and for improving resist removability.

Another aspect of the invention provides a construction which includes a developing means for developing a resist containing a photosensitizer, a light irradiation means for irradiating the resist pattern with light within a range of photosensitive wavelengths of the photosensitizer, and a bake means for performing bake processing at a temperature not lower than a glass transition temperature of the positive resist containing the photosensitizer.

In the above-described construction according to the invention, the light irradiation means is a processing means for irradiating a developed resist pattern with light within the range of photosensitive wavelengths of the photosensitizer, and the light within the range of photosensitive wavelengths of the photosensitizer is generally light of wavelengths 350 nm to 450 nm. A suitable example of a light source which satisfies the range of the wavelengths is a super high pressure mercury lamp of the type which is generally used as a light source in a 1:1 projection aligner using multiple-wavelength light or a 1:1 projection aligner using single-wavelength light. The super high pressure mercury lamp has spectral light including g-line (436 nm), h-line (405 nm) and i-line (365 nm) which satisfy the wavelength range, and it is possible to adopt an apparatus construction which uses a single or plural ones of the lines of the spectral light. A light irradiation means using plural lines of the spectral light includes a super high pressure mercury lamp which is a light source, and an optical filter for transmitting a light spectrum within a particular wavelength range containing two or more wavelengths selected from g-line, h-line and i-line within the range of wavelengths 350-450 nm of the super high pressure mercury lamp. In this case, according to the kind of spectral transmission characteristics, the optical filter may be any type of optical filter that is selected from among an optical filter which transmits a light spectrum within the range of wavelengths including all of g-line (436 nm), h-line (405 nm) and i-line (365 nm), an optical filter which transmits a light spectrum within the range of wavelengths including only g-line (436 nm) and h-line (405 nm), and an optical filter which transmits a light spectrum within the range of wavelengths including only h-line (405 nm) and i-line (365 nm). On the other hand, a light irradiation means using a single line of spectral light includes a super high pressure mercury lamp which is a light source, and an optical filter for transmitting single-wavelength spectral light containing g-line (436 nm), h-line (405 nm) or i-line (365 nm) of the super high pressure mercury lamp. Incidentally, the optical filter which is a constituent element of the light irradiation unit may use an absorption filter and a thin film interference filter, and is constructed to include these absorption filter and thin film interference filter in an appropriately stacked manner to transmit a spectral light within the desired wavelength range.

According to the invention constructed in the above-described, it is possible to perform continuous processing which includes developing processing, light irradiation processing for irradiating a developed resist pattern with light within the range of photosensitive wavelengths of a DNQ photosensitizer, and bake processing for baking the resist pattern at a temperature not lower than the glass transition temperature of the resist pattern. Accordingly, it is possible to positively realize a high-throughput process which satisfies the formation of a resist pattern having the desired sidewall angle (for example, not greater than 50 degrees) and the resist removability of the resist pattern.

BRIEF DESCRIPTION OF THE DRAWINGS

FIGS. 1A to 1D are cross-sectional process diagrams showing the process of forming a resist pattern;

FIGS. 2A to 2F are cross-sectional process diagrams showing the process of fabricating a GOLD-structure TFT;

FIG. 3 is a schematic plane view showing the whole of a developing apparatus;

FIGS. 6A and 6B are cross-sectional process diagrams showing the process of fabricating the active matrix type liquid crystal display device;

FIGS. 7A and 7B are cross-sectional process diagrams showing the process of fabricating the active matrix type liquid crystal display device;

FIGS. 8A and 8B are cross-sectional process diagrams showing the process of fabricating the active matrix type liquid crystal display device;

DETAILED DESCRIPTION OF THE INVENTION

Figure 4A:
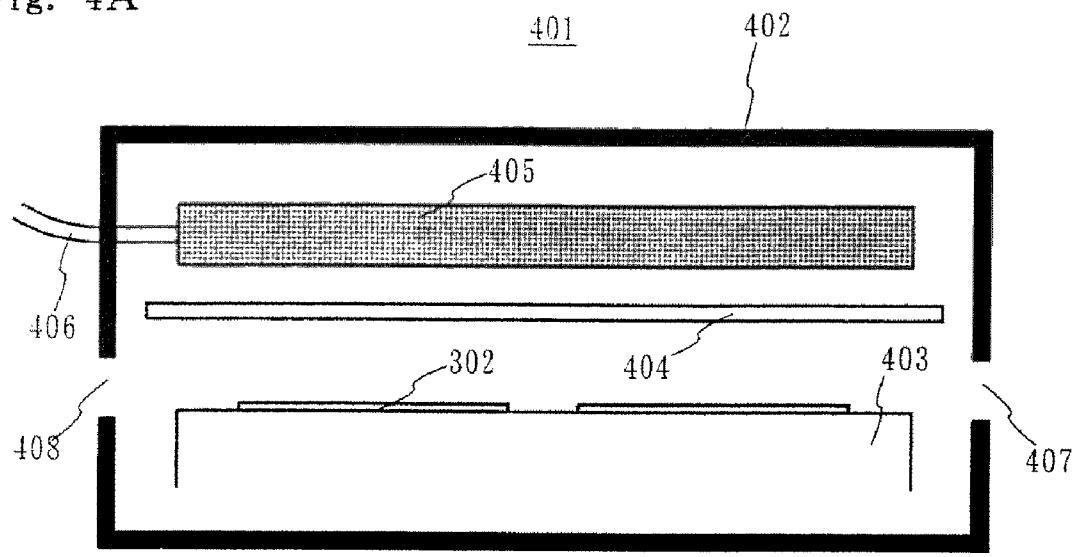
FIGS. 4A and 4B are cross-sectional views showing a specific construction of a light irradiation unit.

Preferred embodiments of the invention will be specifically described below with reference to FIGS. 1 to 10, 14 and 15. Incidentally, it will be readily understood by those skilled in the art that the invention is not limited to any matter to be described later in connection with the preferred embodiments and a positive resist using another type of photosensitizer and a light source adapted to the range of photosensitive wavelengths of the photosensitizer used can be employed without departing from the scope and spirit of the invention.

Embodiment 1

A resist pattern forming method according to Embodiment 1 of the invention will be described below with reference to FIGS. 1A to 1D. FIGS. 1A to 1D are cross-sectional process diagrams showing the resist pattern forming method.

First, a DNQ-novolac resin type of positive resist which is generally applied to a semiconductor device fabricating process is formed with a predetermined film thickness on an insulating transparent glass substrate 101 by spin coating method. After that, a predetermined time of prebake processing at a processing temperature of approximately 100° C. is performed to evaporate the solvent contained in the formed resist film and form a stable resist film, thereby forming a resist film 102 of predetermined film thickness. At this time, since the film thickness of the resist film 102 influences the size of a resist pattern to be finally formed, the precise control of spin conditions for spin coating is needed (refer to FIG. 1A).

Then, a 1:1 projection aligner using multiple-wavelength light (g-line, h-line and i-line) of a super high pressure mercury lamp or a 1:1 projection aligner using single-wavelength light of g-line or i-line is used to perform a predetermined time of exposure processing by means of a mask having an appropriate design pattern. After that, a predetermined time of developing processing is performed with a general-purpose TMAH (abbreviation for Tetra Methyl Ammonium Hydroxide) developing solution (2.38%) which is an organoalkaline developing solution, thereby forming a resist pattern 103. Incidentally, in the case where an aligner to be used is a 1:1 projection aligner using single-wavelength light, the introduction of PEB processing at approximately 120° C. after exposure is essential so that unwanted interference fringes are prevented from being formed on the sidewalls of a developed resist pattern (refer to FIG. 1B).

Then, in order to make the DNQ photosensitizer which exists in the interior of the resist pattern 103 and have not reacted, the entire surface of the substrate 101 is irradiated with light of wavelength between 350 nm and 450 nm which is light within the range of photosensitive wavelength of the DNQ photosensitizer. In this case, suitable examples of the light of wavelengths 350 nm to 450 nm are g-line (436 nm), h-line (405 nm) and i-line (365 nm) which are spectral light of the super high pressure mercury lamp, and in Embodiment 1, a multiple-wavelength light including g-line (436 nm), h-line (405 nm) and i-line (365 nm) of the super high pressure mercury lamp is irradiated onto the developed resist pattern 103. Through this light irradiation step, a resist pattern 104 is formed which contains a large amount of indene carboxylic acid which is a photochemical reaction product from the DNQ photosensitizer. Incidentally, the reason why multiple-wavelength light is used in Embodiment 1 is that its amount of irradiation is large compared to single-wavelength light, so that the DNQ photosensitizer existing in the interior of the developed resist pattern 103 can be exposed within a short time (refer to FIG. 1C).

Then, a predetermined time of bake processing at a temperature not lower than the glass transition temperature of the resist pattern 104 is performed so that the resist pattern 104 after the light irradiation processing is softened and fluidized, thereby forming a resist pattern 105 having a sidewall angle reduced through the softening and fluidization of the resist pattern 104. During this time, the resist pattern 104 is being irradiated with multiple-wavelength light comprising g-line (436 nm), h-line (405 nm) and i-line (365 nm) of the super high pressure mercury lamp, so that a large amount of indene carboxylic acid which is a photoreaction product from the DNQ photosensitizer is produced in the interior of the resist pattern 104. Accordingly, the glass transition temperature of the resist pattern 104 is decreased, and when the resist pattern 104 is to be baked at a temperature not lower than the glass transition temperature, it is possible to realize a decrease in a bake temperature for obtaining the desired sidewall angle of the resist pattern 105. In the case where the bake temperature is not decreased, the sidewall angle of the resist pattern 105 can be made smaller (for example, not greater than 50 degrees) owing to the promotion of softening and fluidization. In addition, as the temperature of bake processing is made higher, the sidewall angle of the resist pattern 105 can be made smaller by softening and fluidization. It is, therefore, necessary that the relationship between the sidewall angle of the resist pattern 105 and the bake temperature be found in advance and the resist pattern 104 be baked at a bake temperature for forming the resist pattern 105 having the desired sidewall angle. Incidentally, in the case where the resist pattern 104 is baked at a temperature not lower than the glass transition temperature, the sidewall angle becomes rounded, so that the sidewall angle of the resist pattern 105 becomes difficult to measure accurately. Accordingly, the profile between a sidewall portion corresponding to a height of 1 μm from the bottom of the resist pattern 105 and the end portion of the resist pattern 105 is linearly approximated, and the angle formed by the obtained approximate straight line and the base substrate 101 is defined as the sidewall angle of the resist pattern 105 (refer to FIG. 1D).

As compared with general resist patterns formed without light irradiation processing, the resist pattern 105 formed in the above-described method has the advantage that when the resist pattern 104 is to be baked at a temperature not lower than the glass transition temperature, a decrease in the bake temperature for obtaining the desired sidewall angle of the resist pattern 105 can be realized by the action of a decrease in the glass transition temperature of the resist pattern 104. In the case where the bake temperature is not decreased, the sidewall angle of the resist pattern 105 can be made smaller owing to the promotion of softening and fluidization. This fact means that in a taper etching process based on a resist-receding method using the resist pattern 105 as a mask, a taper portion can be formed to have a far longer size. In addition, in a resist removing step for the resist pattern 105, owing to the dissolution promotion action of the resist pattern 105 in a resist removing solution, it is possible to completely remove the resist without leaving resist residues, through a resist removing step. Therefore, the resist pattern 105 formed in Embodiment 1 is extremely advantageous for improving the process margin of the taper etching step based on the resist-receding method and for improving resist removability.

Embodiment 2

In the following description of Embodiment 2, based on FIGS. 2A to 2F, reference will be made to the case where the resist pattern forming method according to the invention is applied to a gate electrode forming process which includes a GOLD-structure TFT fabricating process. Incidentally, FIGS. 2A to 2F are cross-sectional process diagrams showing the GOLD-structure TFT fabricating process.

First, the structure of a substrate used in Embodiment 2 will be described. The shown substrate includes a glass substrate 201 which is an electrically insulating transparent substrate, and a base film (not shown) comprising a silicon oxide nitride film having a film thickness of 150 nm is deposited over the glass substrate 201, and a semiconductor layer which is a TFT active layer comprising a polycrystalline silicon film 202 having a film thickness of 50 nm is formed over the base film. A gate insulating film 203a comprising a silicon oxide film having a film thickness of 100 nm, a first-layer gate electrode film 204a comprising a TaN film having a film thickness of 30 nm, and a second-layer gate electrode film 205a comprising a W film having a film thickness of 370 nm are stacked to each other and are deposited to coat the semiconductor layer (refer to FIG. 2A).

In this structure, the base film (not shown) serves to prevent alkali metals such as Na element and K element from diffusing from the glass substrate 201. It is known that the film thickness of the gate insulating film 203a needs to be not smaller than 80 nm so that the gate insulating film 203a can avoid exposure to stress from a gate electrode film (the first-layer gate electrode film 204a and the second-layer gate electrode film 205a) to be formed in a later step to cover the gate insulating film 203a. The film thickness of the gate insulating film 203a is set in view of this point. The film thickness of the first-layer gate electrode film (TaN film) 204a is set in view of both the controllability of the thickness of the TaN film to be left in a taper-shaped region during taper etching and the doping characteristics of doping of an impurity element through the TaN film by a through-doping method. It is known that the film thickness of the second-layer gate electrode film (W film) 205a needs to be not smaller than 340 nm so that the occurrence of a channeling phenomenon in the W film is prevented during doping of an impurity element. The film thickness of the second-layer gate electrode film 205a is set in view of this point. Incidentally, the method of passing an impurity through a film overlying an objective layer to be doped and doping the layer to be doped with the impurity is herein referred to as "through-doping method" for the sake of convenience. In addition, in any of FIGS. 2A to 2F, the illustration of the base film and the semiconductor layer is omitted for the sake of convenience (only the polycrystalline silicon film 202 which is a constituent material of the semiconductor layer is shown).

A resist pattern 206a, for forming the gate electrode, which includes a general-purpose DNQ-novolac resin type of positive resist is formed over the substrate having the above-described structure. At this time, a resist film is formed to a predetermined film thickness by coating the substrate with the DNQ-novolac resin type by spin coating and performing a predetermined time of prebake processing at a processing temperature of approximately 100° C. Incidentally, prebake processing serves to evaporate the solvent contained in the formed resist film and form a stable resist film. After that, a predetermined time of exposure is performed with a 1:1 projection aligner using multiple-wavelength light (g-line, h-line and i-line) of a super high pressure mercury lamp, and then a predetermined time of developing processing is performed with a general-purpose TMAH developing solution (2.38%) which is an organoalkaline developing solution, thereby forming the resist pattern 206a of predetermined size (refer to FIG. 2A).

Then, in order to photosensitize a DNQ photosensitizer which exists in the interior of the developed resist pattern 206a and has not reacted, the entire surface of the substrate is irradiated with light of wavelength between 350 nm and 450 nm which is light within the range of photosensitive wavelength of the DNQ photosensitizer. In this case, suitable examples of the light of wavelength between 350 nm and 450 nm are g-line (436 nm), H-line (405 nm) and i-line (365 nm) which are spectral light of the super high pressure mercury lamp, and in Embodiment 2, multiple-wavelength light including g-line (436 nm), h-line (405 nm) and i-line (365 nm) of the super high pressure mercury lamp is irradiated onto the developed resist pattern 206a. Through this light irradiation step, a large amount of indene carboxylic acid which is a photochemical reaction product from the DNQ photosensitizer is produced in the interior of the resist pattern 206a. Incidentally, the reason why multiple-wavelength light is used in Embodiment 2 is that its amount of irradiation is large compared to single-wavelength light, so that the DNQ photosensitizer existing in the interior of the developed resist pattern 206a can be exposed within a short time. Then, a predetermined time of bake processing at a temperature not lower than the glass transition temperature of the resist pattern 206a is performed so that the resist pattern 206a is softened and fluidized, thereby forming a resist pattern 206b of predetermined size which has a sidewall angle reduced through the softening and fluidization of the resist pattern 206a. At this time, a large amount of indene carboxylic acid is already produced in the interior of the resist pattern 206a owing to the previous light irradiation step. Accordingly, the glass transition temperature of the resist pattern 206a is decreased, and when the resist pattern 206a is to be baked at a temperature not lower than the glass transition temperature, it is possible to realize a decrease in a bake temperature for obtaining the desired sidewall angle of the resist pattern 206b. In the case where the bake temperature is not decreased, the sidewall angle of the resist pattern 206b can be made smaller (for example, not greater than 50 degrees) owing to the promotion of softening and fluidization. In addition, as the temperature of bake processing is made higher, the sidewall angle of the resist pattern 206b can be made smaller by softening and fluidization. It is, therefore, necessary that the relationship between the sidewall angle of the resist pattern 206b and the bake temperature be found in advance and the resist pattern 206a be baked at a bake temperature for forming the resist pattern 206b having the desired sidewall angle. Incidentally, in the case where the resist pattern 206a is baked at a temperature not lower than the glass transition temperature, the sidewall angle becomes rounded, so that the sidewall angle of the resist pattern 206b becomes difficult to measure accurately. Accordingly, the profile between a sidewall portion corresponding to a height of 1 μm from the bottom of the resist pattern 206b and the end portion of the resist pattern 206b is linearly approximated, and the angle formed by the obtained approximate straight line and the base substrate is defined as the sidewall angle of the resist pattern 206b (refer to FIG. 2B).

Then, three-step etching processing which is composite etching processing including taper etching processing and anisotropic etching processing is performed by using the resist pattern 206b as a mask, thereby forming a gate electrode which includes a first-layer gate electrode 204d (corresponding to a region exposed from the second-layer gate electrode 205d) including the TaN film having a forwardly tapered shape and a second-layer gate electrode 205d including the W film having a shape close to a rectangle. As compared with general resist patterns, the resist pattern 206b has the advantage that the sidewall angle of the resist pattern 206b can be made small to a further extent through bake processing at a temperature not lower than the glass transition temperature owing to the action of a decrease in the glass transition temperature of the resist pattern 206a. Accordingly, in the three-step etching step, the tapered region of the first-layer gate electrode 204d that corresponds to the region exposed from the second-layer gate electrode 205d can be formed to have a further longer size. A high-density plasma type of ICP dry etching apparatus (the name of the apparatus: E645) which is made by Matsushita Electric Industrial, Co. Ltd. is used as a dry etching apparatus, and etching is performed while the resist pattern 206b is being made to recede by lowering a selectivity relative to the resist pattern 206b (refer to FIGS. 2C to 2E).

Specific processing of the three-step etching step is as follows. Namely, as the first step of etching processing, only the second-layer gate electrode film 205a formed of the W film is taper-etched by using the resist pattern 206b as a mask, to form a second-layer gate electrode 205b having a forwardly tapered shape. The etching conditions for this taper etching are as follows: the flow rate of $CF_4$, $Cl_2$ and $O_2$ in a mixed gas thereof are 25 sccm ($CF_4$), 25 sccm ($Cl_2$) and 10 sccm ($O_2$), respectively; ICP power is 500 W (ICP power density: 1.019 $W/cm^2$); bias power is 150 W (bias power density: 0.96 $W/cm^2$); and gas pressure is 1.0 Pa, and dry etching processing is performed with an etching time determined by adding the time of 10% overetching to the time of Just etching (generally, approximately 120 seconds). Incidentally, the resist pattern 206b which serves as a mask during the dry etching processing is deformed into the shape of a resist pattern 206c by the resist-receding phenomenon (refer to FIG. 2C).

Subsequently, as the second step of etching processing, the first-layer gate electrode 204b including the TaN film is anisotropically etched by using the second-layer gate electrode 205b including the W film as a mask, to form a first-layer gate electrode 204c. The etching conditions for this anisotropic etching are as follows: the flow rate of $CF_4$ and $Cl_2$ in a mixed gas thereof are 30 sccm ($CF_4$) and 30 sccm ($Cl_2$), respectively; ICP power is 500 W (ICP power density: 1.019 $W/cm^2$); bias power is 10 W (bias power density: 0.064 $W/cm^2$); and gas pressure is 1.0 Pa, and dry etching processing is performed with an etching time determined by adding 15 seconds of overetching to the time of just etching (generally, approximately 45 seconds). Incidentally, the resist pattern 206c is deformed into the shape of a resist pattern 206d. In addition, the thickness of the gate insulating film 203a including a silicon oxide film is reduced by the dry etching processing and the gate insulating film 203a is deformed into the shape of a gate insulating film 203b (refer to FIG. 2D).

Subsequently, as the third step of etching processing, only a second-layer gate electrode 205c including the W film is anisotropically etched by using the resist pattern 206d as a mask, to form the second-layer gate electrode film 205d having a shape close to a rectangle and the first-layer gate electrode 204d having a forwardly tapered shape (that corresponds to an exposed region from the second-layer gate electrode film 205d). The etching conditions for this anisotropic etching are as follows: the flow rate of $CF_4$, $Cl_2$ and $O_2$ in a mixed gas thereof are 24 sccm ($CF_4$), 12 sccm ($Cl_2$) and 24 sccm ($O_2$): ICP power is 700 W (ICP power density: 1.427 $W/cm^2$); bias power is 4 W (bias power density: 0.026 $W/cm^2$); and gas pressure is 1.3 Pa, and dry etching processing is performed with a fixed etching time of 25 seconds. Incidentally, the thickness of the gate insulating film 203b including a silicon oxide film is reduced to a further extent by the dry etching processing and is deformed into the shape of a gate insulating film 203c, while the resist pattern 206d recedes to a further extent and is deformed into the shape of a resist pattern 206e (refer to FIG. 2E).

Then, resist removing processing which includes an ashing step and a resist removing step is performed on the resist pattern 206e which serves as the mask during the dry etching processing. In the resist pattern 206e after the dry etching processing, since the reaction of polymers which constitute the resist with the etching gas and the cross-linking reaction of the polymers proceed, a deteriorated layer difficult to remove is produced on the surface of the resist pattern 206e. The ashing step which is the processing of effecting decomposition into carbon dioxide by means of oxygen plasma is suited to the processing of removing the deteriorated layer, and the resist removing step which is dissolution processing using an organic resist removing solution is suited to the processing of removing the resist pattern 206e after the removal of the deteriorated layer. For this reason, in Embodiment 2, after the processing of removing the deteriorated layer by means of the ashing step has been performed, the resist removing step using an organic resist removing solution is performed. Incidentally, the resist pattern 206e after the dry etching processing contains a large amount of indene carboxylic acid which is produced by the irradiation of the developed resist pattern 206a with multiple-wavelength light formed of g-line (436 nm), h-line (405 nm) and i-line (365 nm) of the super high pressure mercury lamp. Accordingly, the resist material which is left as the resist pattern 206e when the deteriorated layer is removed from the surface portion of the resist pattern 206e by ashing is promoted in its solubility in the resist removing solution, whereby it is possible to completely remove the resist material without leaving resist residues, through the resist removing step (refer to FIG. 2F).

Then, an ion doping apparatus is used to dope a high dose of n-type impurity including P (phosphorus) element. Through this doping processing, a heavily doped n-type impurity region ($n^+$ region) 207 is formed by a through-doping method in the semiconductor layer of the polycrystalline silicon film 202 that corresponds to the outside of the first-layer gate electrode 204d, and at the same time, a lightly doped n-type impurity region ($n^-$ region) 208 is formed by a through-doping method in the semiconductor layer of the polycrystalline silicon film 202 that corresponds to the region of the first-layer gate electrode 204d that is exposed from the second-layer gate electrode film 205d. The heavily doped impurity region ($n^+$ region) 207 formed in this manner has the function of the source region or the drain region of the TFT, while the lightly doped impurity region ($n^-$ region) 208 has the function of a Lov region 209 serving as a field relaxing region which overlaps the gate electrode. Incidentally, as doping conditions, it is possible to use the condition that a phosphine ($PH_3$)/hydrogen ($H_2$) gas in which phosphine ($PH_3$) is diluted with hydrogen ($H_2$) to a dilution ratio of 3-20% is used as an ion source and doping is performed at an acceleration voltage of 30-90 kV with a dose of $6 \times 10^{14}$ to $1.5 \times 10^{15}$ atoms/$cm^2$. In Embodiment 2, a phosphine ($PH_3$)/hydrogen ($H_2$) gas in which phosphine ($PH_3$) is diluted with hydrogen ($H_2$) to a dilution ratio of 5% is used as an ion source and doping is performed at an acceleration voltage of 65 kV with a dose of $3 \times 10^{15}$ atoms/$cm^2$ (refer to FIG. 2F).

The heavily doped impurity region ($n^+$ region) 207 and the lightly doped impurity region ($n^-$ region) 208 are formed by a so-called through-doping method of performing doping processing via an overlying film. The term "through-doping method" used herein means a doping method of doping an impurity into an objective doping layer via an overlying film, and is characterized in that the concentration of the impurity in the doping layer can be varied depending on the material and the thickness of the overlying film. Accordingly, although the impurity is doped under the same doping conditions, it is possible to form the heavily doped impurity region ($n^+$ region) 207 in a region which underlies a film comprising the gate insulating film 203c having a small ion blocking capability, and at the same time, it is possible to form the lightly doped impurity region ($n^-$ region) 208 in a region which underlies a stacked film having a large ion block capability, which stacked film includes the first-layer gate electrode (TaN film) 204d and the gate insulating film 203c (refer to FIG. 2F).

In the case where the resist pattern forming method according to the invention is applied to an n-channel type GOLD-structure TFT fabricating process, it is possible to achieve the following specific effects and advantages. The glass transition temperature of a gate electrode forming resist pattern is decreased by irradiating the gate electrode forming resist pattern with light of wavelength between 350 nm and 450 nm which is light within the range of photosensitive wavelength of a DNQ photosensitizer, whereby when the resist pattern is to be baked at a temperature not lower than the glass transition temperature, a decrease in a bake temperature for obtaining the desired sidewall angle of the resist pattern can be realized. In the case where the bake temperature is not decreased, the sidewall angle of the resist pattern can be made smaller owing to the promotion of softening and fluidization. The fact that the sidewall angle of the resist pattern can be made smaller means that a Lov region to be formed in a composite etching step including taper etching processing and anisotropic etching processing can be controlled to have a further larger size. Accordingly, the resist pattern forming method of Embodiment 2 is advantageous for improving a process margin for TFT characteristics. In addition, in the processing of removing the resist pattern after dry etching processing, it is possible to completely remove the resist pattern without leaving resist residues, through the ashing step and the resist removing step.

Embodiment 3

In the following description of Embodiment 3, a developing apparatus capable of performing continuous processing on the resist pattern forming process according to the invention will be described with reference to FIGS. 3 to 4. FIG. 3 is a schematic plan view showing the whole of the developing apparatus, and FIGS. 4A and 4B are cross-sectional views showing a specific construction of a light irradiation unit which constitutes a feature of the invention.

FIG. 3 is a schematic plan view showing the whole of the developing apparatus capable of performing continuous processing on the resist pattern forming process according to the invention, and shows a substrate-by-substrate processing type of developing apparatus 301 capable of continuously processing substrates to be processed one-by-one. The developing apparatus 301 includes a loader-side carrier 303 capable of accommodating a plurality of substrates 302 to be processed (generally, approximately twenty substrates), a plurality of processing units 304, 305, 307 and 308 for processing the substrates to be processed 302, a buffer 306 for temporarily accommodating a substrate to be processed 302 during processing and transferring the substrate to be processed 302 to an adjacent processing unit, an unloader-side carrier 310 capable of accommodating processed substrates 309, and a substrate conveying unit (not shown) for conveying the substrate to be processed 302. The substrates to be processed 302 accommodated in the loader-side carrier 303 are conveyed one-by-one in the directions indicated by arrows (→) in FIG. 3 by the substrate conveying unit (not shown), and are sequentially processed in each of the processing units 304, 305, 307 and 308. Each of the processing units 304, 305, 307 and 308 of the developing apparatus 301 includes a PEB processing unit 304 for applying PEB processing to a substrate to be processed 302 which has been coated with a resist film and passed through exposure processing, a developing unit 305 for performing development processing on the substrate to be processed 302, a light irradiation unit 307 for irradiating a developed resist pattern on the substrate to be processed 302 with light within the range of photosensitive wavelengths of a DNQ photosensitizer, and a bake processing unit 308 for applying bake processing to the resist pattern on the substrate to be processed 302 at a temperature not lower than the glass transition temperature of the resist pattern (refer to FIG. 3).

A specific construction of each of the processing units 304, 305, 307 and 308 of the developing apparatus 301 having the above-described construction will be described below the flow of processing. The PEB processing unit 304 which is the first processing unit is a processing unit for performing PEB processing on an exposed resist film on the substrate to be processed 302, and constituted from a general hot plate having a built-in heater. Incidentally, there are a photolithography process with PEB processing and a photolithography process without PEE processing, and in the following description of Embodiment 3, reference will be made to the case where the developing apparatus 301 includes the PEE processing unit 304 as standard equipment so that the developing apparatus 301 can cope with either of the photolithography processes. In the case of the photolithography process with PEE processing, the temperature of the hot plate may be set to approximately 120° C. which is the temperature of PEB processing. On the other hand, in the case of the photolithography process without PEB processing, the temperature of the hot plate may be set to a temperature of approximately 30° C. which does not influence a resist film, whereby the PEB processing unit 304 can be made to cope with the photolithography process without PEB processing.

Figure 4B:
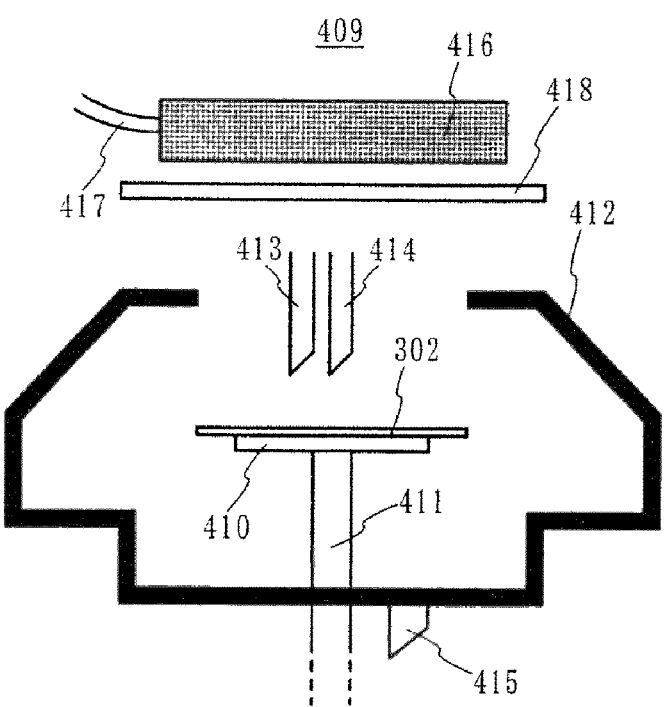
Figures 5A, 5B:
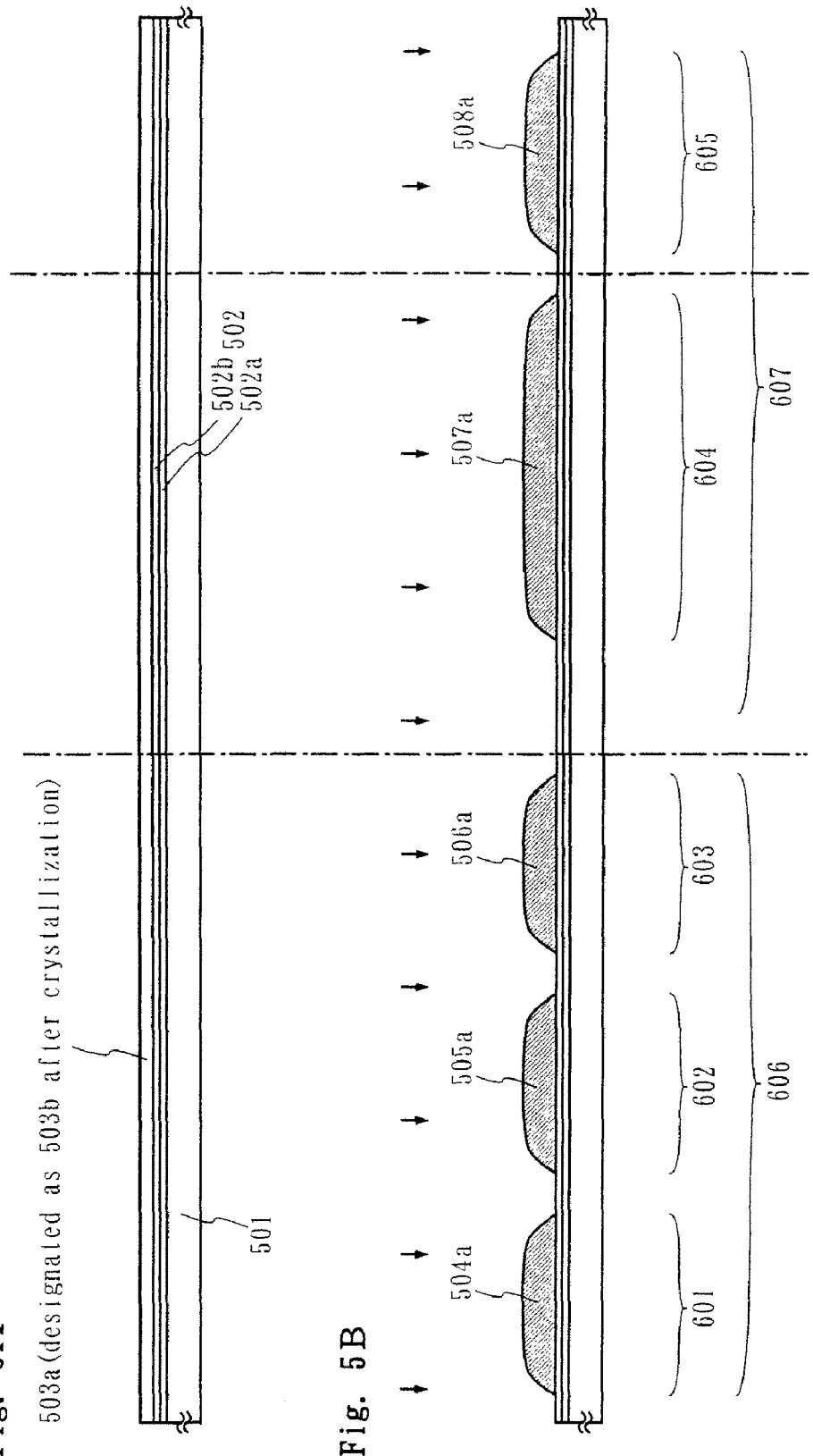
FIGS. 5A and 5B are cross-sectional process diagrams showing the process of fabricating an active matrix type liquid crystal display device.
Figure 9A:
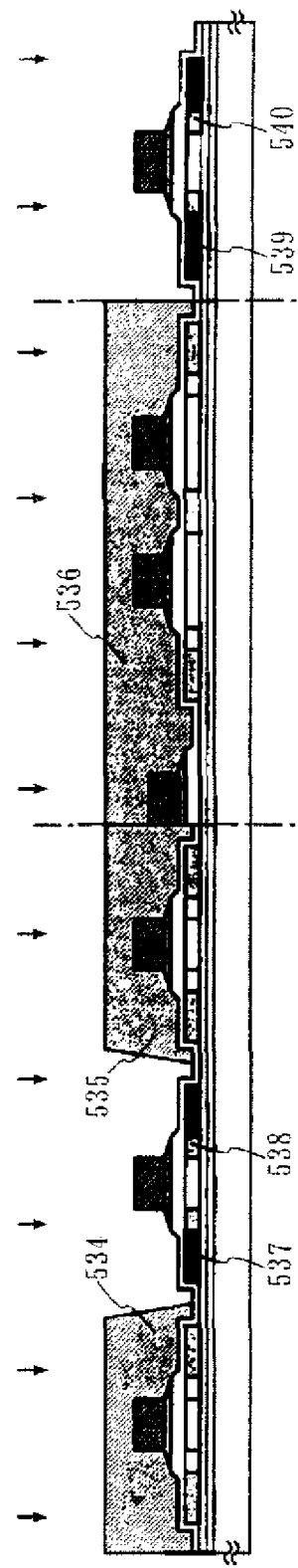
FIGS. 9A and 9B are cross-sectional process diagrams showing the process of fabricating the active matrix type liquid crystal display device.
Figure 9B:
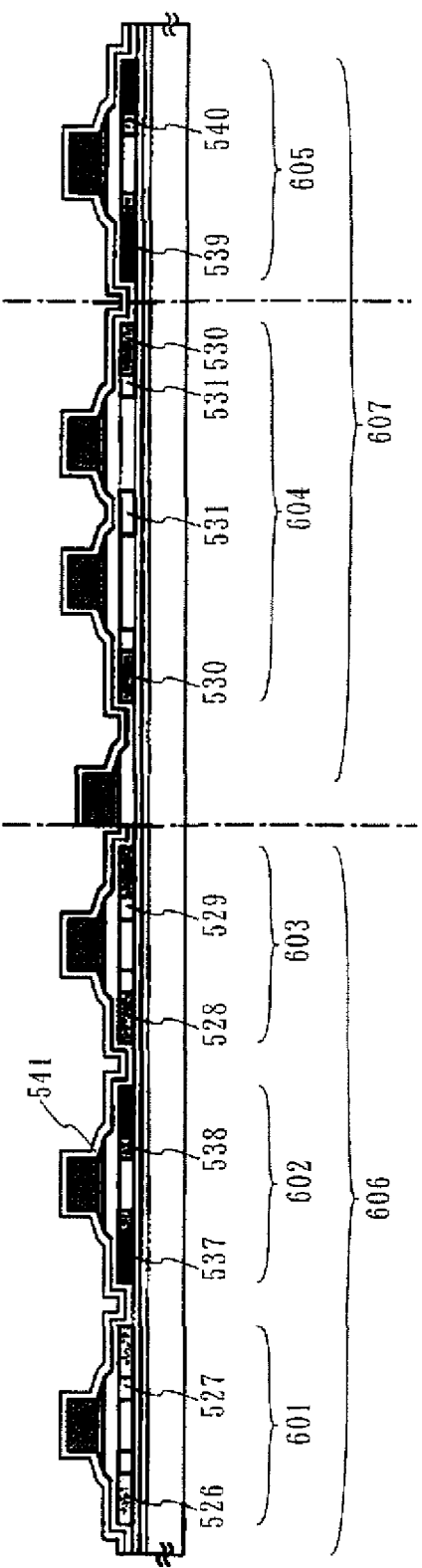
Figures 10A, 10B:
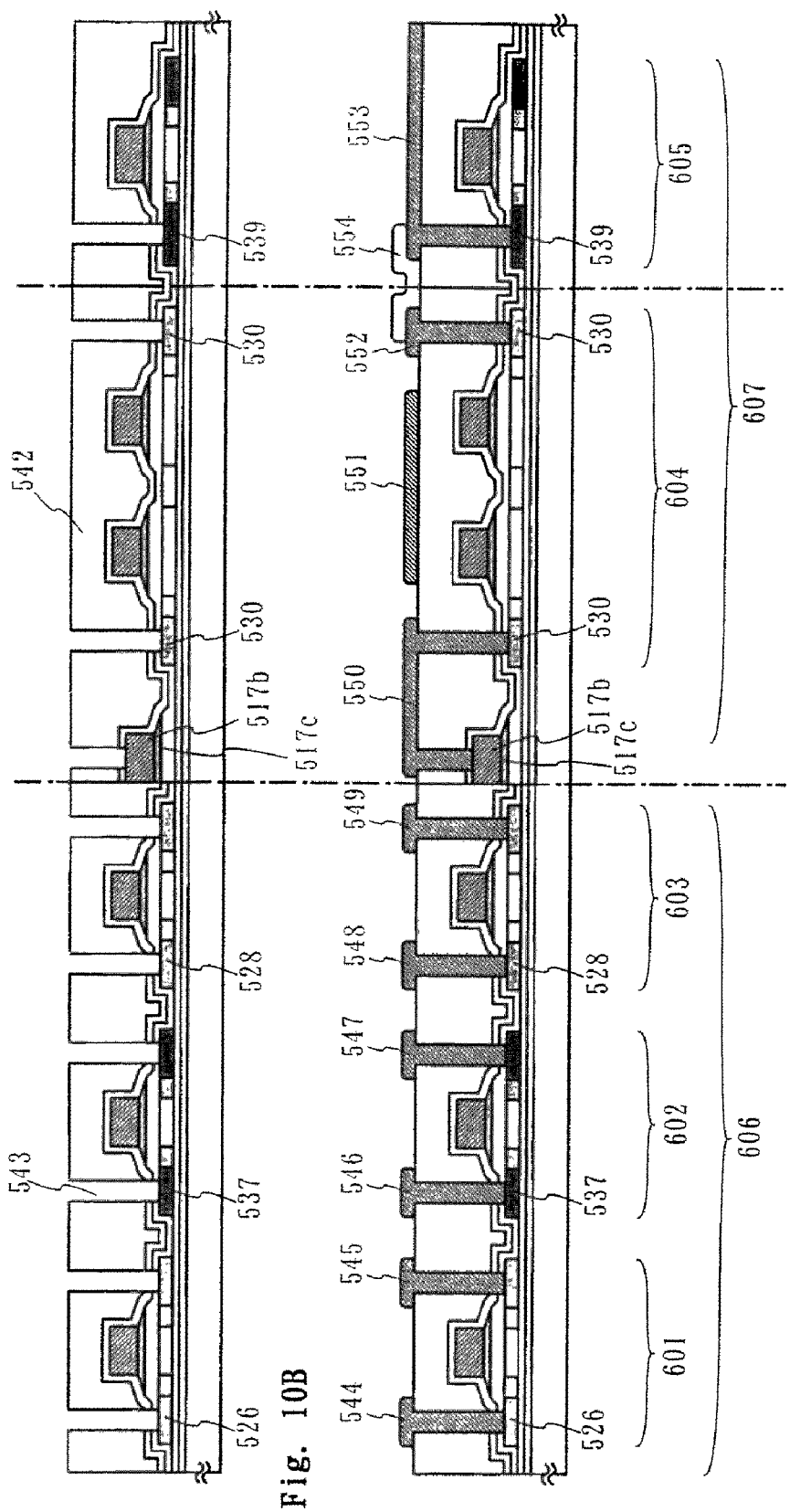
FIGS. 10A and 10B are cross-sectional process diagrams showing the process of fabricating the active matrix type liquid crystal display device.
Figure 11A:
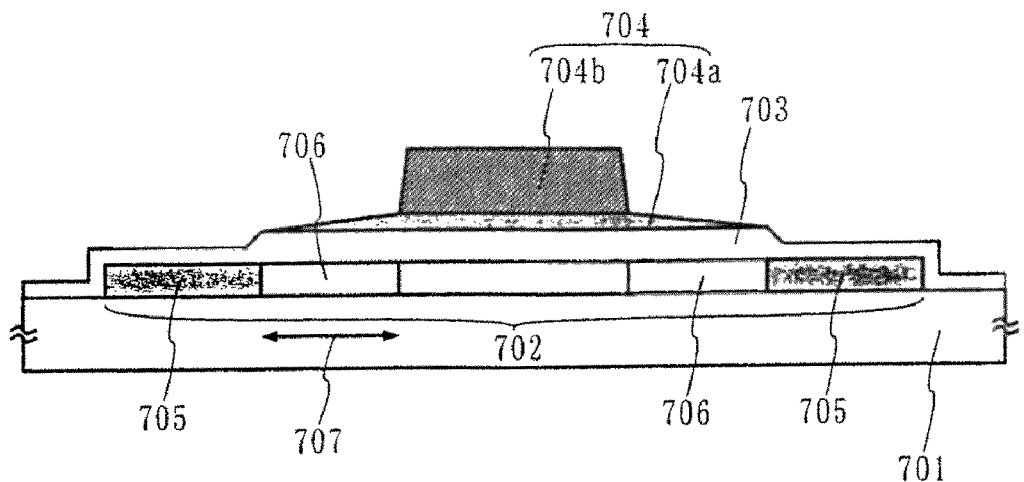
FIGS. 11A and 11B are cross-sectional views showing the structure of a GOLD-structure TFT and a graph showing correlation data indicative of the correlation between the sidewall angle of a resist pattern and the size of a Lov region.
Figure 11B:
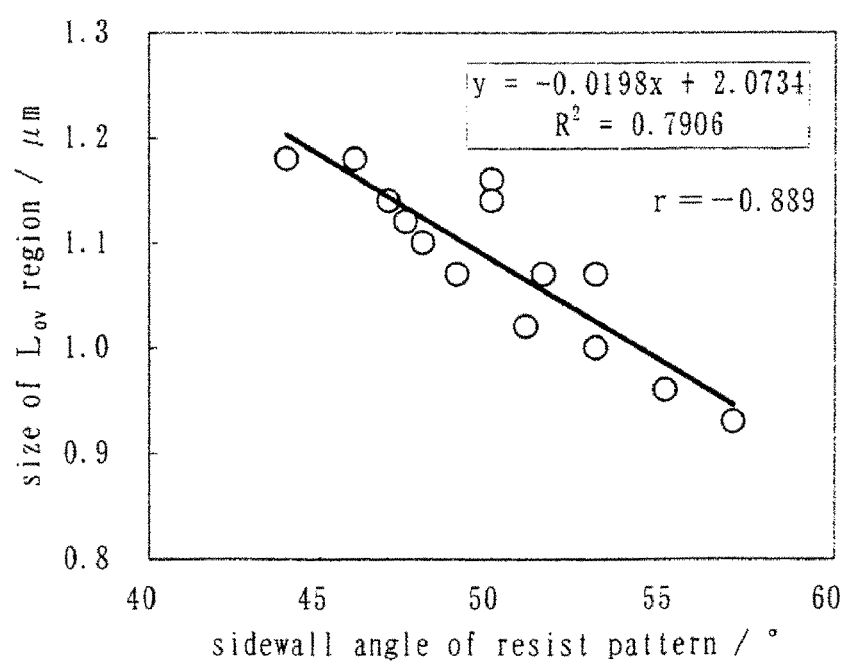
Figure 12:
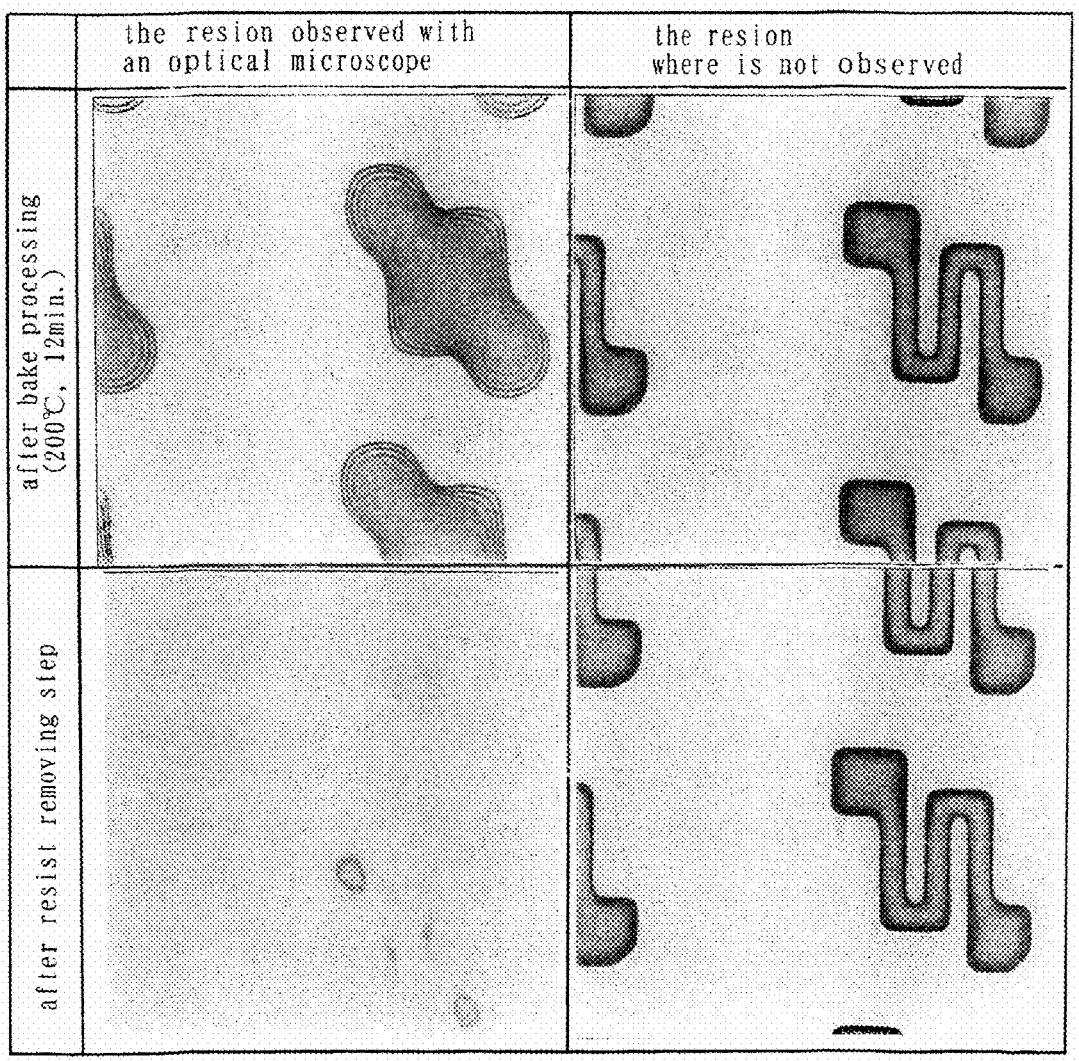
FIG. 12 is optical-microscope photographic data showing the result of Experiment 1.
Figure 13:
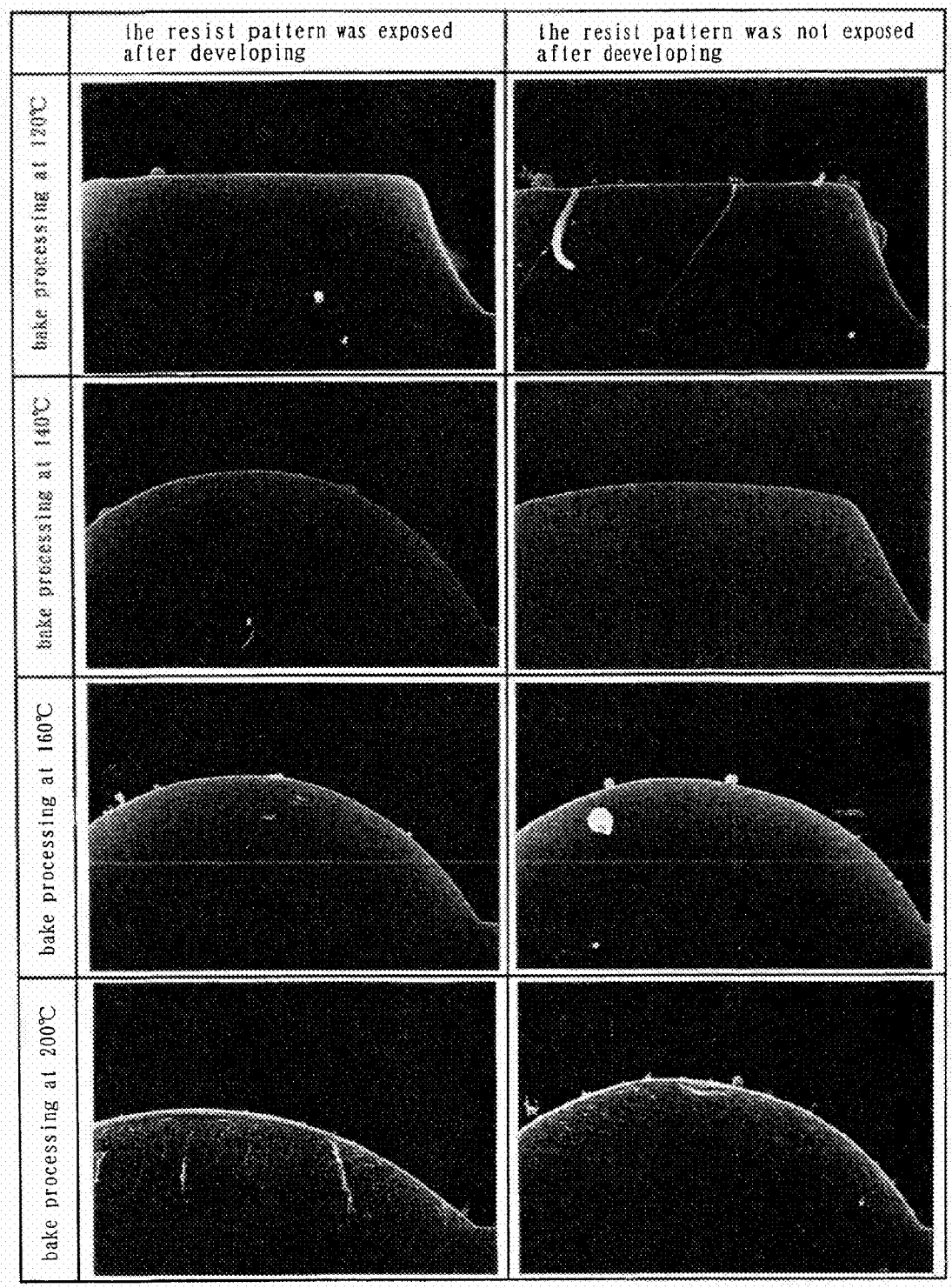
FIG. 13 is cross-sectional SEM photographic data showing the result of Experiment 2.

The developing unit 305 which is the next processing unit includes a puddle development type of processing unit which is shown on the bottom side of FIG. 4B (except the light irradiation unit shown on the top side of FIG. 4B). Specifically, a spin chuck 410 on which to place the substrate to be processed 302 and a rotary shaft 411 connected to the spin chuck 410 for rotationally driving the spin chuck 410 are disposed in the central portion of a processing cup 412. A developing solution supplying nozzle 413 for supplying a developing solution and a purified water supplying nozzle 414 for supplying purified water are disposed over the spin chuck 410 so that the developing solution or the purified water is supplied to the top surface of the substrate to be processed 302 on the spin chuck 410 while the substrate to be processed 302 is being rotated. A drain port 415 for draining a processing solution such as the developing solution or the purified water is disposed at the bottom of the processing cup 412. The next buffer 306 serves to temporarily accommodate the substrate to be processed 302 which is being processed, and transfer the substrate to be processed 302 to an adjacent processing unit, and in Embodiment 3, the buffer 306 is disposed between the developing unit 305 and the light irradiation unit 307 (refer to FIG. 3 and FIG. 4B).

The next processing unit is the light irradiation unit 307. The light irradiation unit 307 is a processing unit for irradiating a developed resist pattern, which is an important element of the invention, with light within the range of photosensitive wavelength of the DNQ photosensitizer. The light within the range of photosensitive wavelength of the DNQ photosensitizer depends on the kind of DNQ photosensitizer, but generally uses light of wavelengths 350 nm to 450 nm. A suitable example of a light source which satisfies the range of the wavelength is a super high pressure mercury lamp of the type which is generally used as a light source in a 1:1 projection aligner using multiple-wavelength light or a 1:1 projection aligner using single-wavelength light. In Embodiment 3, the light irradiation unit 307 is constructed to irradiate multiple-wavelength light including g-line (436 nm), h-line (405 nm) and i-line (365 nm) which are spectral light of a super high pressure mercury lamp. Specifically, the light irradiation unit 307 includes a light irradiation unit 401 having an apparatus construction as shown in FIG. 4A. The light irradiation unit 401 includes a processing chamber 402, a substrate supporting stage 403 disposed in the processing chamber 402, an optical filter 404 positioned over the substrate supporting stage 403, a super high pressure mercury lamp 405 which is a light source positioned over the optical filter 404, and a power supplying line 406 for supplying power to the super high pressure mercury lamp 405. The optical filter 404 may use an absorption filter and a thin film interference filter. The optical filter 404 is constructed to include these absorption filter and thin film interference filter in an appropriately stacked manner to transmit a particular light spectrum of multiple-wavelength light including g-line (436 nm), h-line (405 nm) and i-line (365 nm). A loading port 407 through which to load the substrates to be processed 302 and an unloading port 408 through which to unload the substrates to be processed 302 are respectively disposed on the opposite sides of the processing chamber 402 in such a manner as to have appropriate aperture areas, respectively. Incidentally, the processing time of light irradiation need not be strict like the exposure time of the exposure apparatus, but influences the shape of a softened resist pattern, so that it is necessary to use an apparatus construction which can perform a predetermined time of light irradiation processing. Although not shown, as such an apparatus construction, it is possible to use a unit such as a shutter mechanism or a mechanism which supplies electrical power to the super high pressure mercury lamp 405 for only a predetermined time (refer to FIGS. 3 and 4A).

The light irradiation unit 401 which independently performs only light irradiation processing has been described above as one example of the light irradiation unit 307, but may also use an apparatus construction in which the developing unit 305 and the light irradiation unit 307 are connected to each other. A specific apparatus construction is shown in FIG. 4B. FIG. 4B shows the apparatus construction of a developing unit 409 of the type which has a built-in light irradiation unit. The apparatus construction of the developing unit 409 is such that a super high pressure mercury lamp 416 which is a light source, a power supplying line 417 for supplying electrical power to the super high pressure mercury lamp 416, and an optical filter 418 are disposed over the puddle development type of processing unit (since the specific construction of the puddle development type of processing unit has been described above, the same description is omitted). In this apparatus construction, after a resist pattern of predetermined size has been formed on the substrate to be processed 302 by developing processing, the resist pattern is subjected to a predetermined time of light irradiation. Incidentally, the construction of the optical filter 418 and the apparatus construction for performing the predetermined time of light irradiation are basically the same as those of the light irradiation unit 401 (refer to FIG. 4B).

The next processing unit is the bake processing unit 308. The bake processing unit 308 is a processing unit for performing bake processing on the resist pattern on the substrate to be processed 302 at a temperature not lower than the glass transition temperature of the resist pattern, and includes a hot plate similar to that of the PEB processing unit 304. The temperature of the hot plate is freely adjustable within a predetermined temperature range, for example, a temperature range of approximately 30-250° C., and is set to a temperature not lower than the glass transition temperature so that the sidewall angle of the resist pattern becomes the desired sidewall angle (refer to FIG. 3).

The developing apparatus having the above-described construction can perform continuous processing which includes developing processing, light irradiation processing for irradiating a developed resist pattern with light within the range of photosensitive wavelength of the DNQ photosensitizer, and bake processing for baking the resist pattern at a temperature not lower than the glass transition temperature of the resist pattern. Accordingly, the developing apparatus according to the invention can positively realize a high-throughput process which satisfies the formation of a resist pattern having the desired sidewall angle (for example, not greater than 50 degrees) and the resist removability of the resist pattern.

Embodiment 4

In Embodiment 4 to be described below with reference to FIGS. 5A to 10B, reference will be made to the case where the developing apparatus capable of performing continuous processing on the resist pattern forming process according to the invention is applied to the process of fabricating an active matrix type liquid crystal display device having both GOLD-structure TFTs and LDD-structure TFTs. FIGS. 5A to 10B are cross-sectional process diagrams showing the fabrication process of the active matrix type liquid crystal display device. In the description of Embodiment 4, reference will also be made to the case where a crystalline silicon film crystallized with a catalyst element is applied to a semiconductor layer which is an active layer of such a TFT.

First, a first-layer silicon oxide nitride film 502a having a film thickness of 50 nm and a second-layer silicon oxide nitride film 502b having a film thickness of 100 nm are deposited in mutually different composition ratios over a glass substrate 501 by a plasma CVD method, thereby forming a base film 502. Incidentally, the glass substrate 501 used in this step comprises quartz glass, barium boro-silicate glass, alumino boro-silicate glass or the like. Then, an amorphous silicon film 503a having a film thickness of 20-200 nm, preferably 30-70 nm, is deposited over the base film 502 (502a and 502b) by a plasma CVD or a low-pressure CVD. In Embodiment 4, an amorphous silicon film 503a having a film thickness 53 nm is deposited by plasma CVD. In this step, an extremely thin natural oxide film (not shown) is formed over the surface of the amorphous silicon film 503a by the influence of the oxygen of air contained in the processing atmosphere. Incidentally, although in Embodiment 4 the amorphous silicon film 503a is deposited by plasma CVD, the amorphous silicon film 503a may also be deposited by low-pressure CVD (refer to FIG. 5A).

During the deposition of the amorphous silicon film 503a, there is a possibility that carbon, oxygen and nitrogen which exist in the air contaminate the amorphous silicon film 503a. It is experientially known that contamination by these impurity gases causes degradation of TFT characteristics to be finally obtained, and there is a case where contamination by an impurity gas serves the cause of inhibiting crystallization. Therefore, contamination by impurity gases needs to be completely removed. Specifically, it is preferable to control each of carbon and nitrogen to not greater than $5\times10^{17}$ atoms/cm$^3$ and oxygen to not greater than $1\times10^{18}$ atoms/cm$^3$ (refer to FIG. 5A).

Then, the substrate 501 is washed with dilute hydrofluoric acid for a predetermined time, thereby removing the natural oxide film (not shown) deposited over the surface of the amorphous silicon film 503a. After that, a predetermined time of processing is performed with ozone-containing water, thereby depositing a clean extremely thin silicon oxide film (not shown) having a film thickness of approximately 0.5-5 nm over the surface of the amorphous silicon film 503a. Although, in Embodiment 4, processing with ozone-containing water is performed for the deposition of the silicon oxide film (not shown), the deposition of the silicon oxide film (not shown) may also be performed by processing with hydrogen peroxide water. Incidentally, the silicon oxide film (not shown) is deposited in order to improve the wettability of the amorphous silicon film 503a so that Ni element can be uniformly added when a Ni (nickel) element solution which is a solution containing a catalyst element (hereinafter abbreviated as a catalyst element solution) is coated by spin coating (refer to FIG. 5A).

Then, the entire surface of the amorphous silicon film 503a (exactly, the extremely thin silicon oxide film) is coated with the Ni element solution which is the catalyst element solution having the action of promoting crystallization, by spin coating. In Embodiment 4, a solution obtained by dissolving nickel acetate, which is a Ni compound, in purified water to adjust the concentration of nickel acetate to 10 ppm is used as the Ni element solution, whereby a Ni-containing layer (not shown) is formed to be added uniformly over the entire surface of the amorphous silicon film 503a (exactly, over the extremely thin silicon oxide film) (refer to FIG. 5A).

Then, dehydrogenation processing is performed on the hydrogen contained in the amorphous silicon film 503a, in order to control the content of hydrogen in the amorphous silicon film 503a not to be greater than 5 atom %. The dehydrogenation processing is performed by one hour of thermal processing at 450° C. in a nitrogen atmosphere by use of a furnace. After that, four hours of thermal processing at 550° C. in the furnace is performed to promote the crystallization of the amorphous silicon film 503a, thereby forming a crystalline silicon film 503b having a film thickness of 50 nm. Subsequently, a crystallization of the obtained crystalline silicon film 503b is performed by irradiation with a pulse oscillating type KrF excimer laser (with wavelength of 248 nm) in order to improve the crystallinity of the crystalline silicon film 503b to a further extent. Incidentally, the term "crystalline silicon film" is herein used in order that a polycrystalline silicon film crystallized by using Ni element which is a catalyst element be distinguished from general polycrystalline silicon films. The reason why the term "crystalline" is herein used instead of the term 'polycrystalline' is that as compared with general polycrystalline silicon films, the crystalline silicon film has crystal grains oriented in approximately the same direction and has an advantage such as high field effect mobility, and therefore, needs to be distinguished from general polycrystalline silicon films (refer to FIG. 5A).

Then, a predetermined time of washing before channel doping is performed with dilute hydrofluoric acid solution and ozone-containing water, whereby a clean, extremely thin silicon oxide film (not shown) having a film thickness of approximately 0.5-5 nm is formed over the surface of the crystalline silicon film 503b. The silicon oxide film (not shown) is intended to prevent the crystalline silicon film 503b from being etched by hydrogen ions (a mixed gas of hydrogen and diborane ($B_2H_6$) which is an ion source) during a channel doping processing. After that, the channel doping processing which is the first doping processing is performed with the ion doping apparatus in order to control the threshold voltages of n-channel type TFTs and p-channel type TFTs. The channel doping processing is performed by doping the entire surface of the substrate with a low dose of B (boron) element which is a p-type impurity. As doping conditions for this step, it is possible to use the condition that a diborane ($B_2H_6$)/hydrogen ($H_2$) gas in which diborane ($B_2H_6$) is diluted with hydrogen ($H_2$) to a dilution ratio of 0.01-1% is used as an ion source and doping is performed at an acceleration voltage of 5-30 kV with a dose of $8 \times 10^{13}$ to $2 \times 10^{15}$ atoms/cm$^2$. In Embodiment 4, a diborane ($B_2H_6$)/hydrogen ($H_2$) gas in which diborane ($B_2H_6$) is diluted with hydrogen ($H_2$) to a dilution ratio of 0.1% is used as an ion source and B element is doped at an acceleration voltage of 15 kV with a dose of $4 \times 10^{14}$ atoms/cm$^2$ (refer to FIG. 2F) so that the concentration of B in the crystalline silicon film 503b is controlled to approximately $1 \times 10^{17}$ atoms/cm$^3$ in Embodiment 4 (refer to FIG. 5B).

Then, the extremely thin natural oxide film (not shown) is deposited as the preprocessing of the channel doping processing is processed with dilute hydrofluoric acid solution, thereby removing the silicon oxide film (not shown). After that, a predetermined time of processing is performed with ozone-containing water, thereby forming an extremely thin silicon oxide film (not shown) having a film thickness of approximately 0.5-5 nm over the surface of the crystalline silicon film 503b. The extremely thin silicon oxide film (not shown) is formed for the purposes of improving the adhesion of the next resist pattern to be formed, improving the hydrophobicity of the crystalline silicon film 503b, preventing the contamination of the crystalline silicon film 503b, and reducing an interfacial level by retaining the cleanness of the surface of the crystalline silicon film 503b. Incidentally, in Embodiment 4, the silicon oxide film (not shown) having a film thickness of approximately 0.5-5 nm is formed by processing using ozone-containing water, but such silicon oxide film may also be formed by processing with hydrogen peroxide water, or ozone may be produced by irradiation with ultraviolet rays in an oxygen-containing atmosphere to oxidize the surface of the crystalline silicon film 503b through the oxidation action of ozone (refer to FIG. 5B).

Then, the resist patterns 504a to 508a each including a general-purpose DNQ-novolac resin type of positive resist are formed by a photolithography step to which the developing apparatus capable of performing continuous processing on the resist pattern forming step according to the invention is applied. The resist patterns 504a to 508a are resist patterns to form island-shapedsemiconductor layers which constitute the active layers of TFTs. A specific forming process for the resist patterns is as follows (refer to FIG. 5B).

Namely, a DNQ-novolac resin type of positive resist is applied by spin coating, and a predetermined time of prebake processing at a processing temperature of approximately 100° C. is performed, thereby depositing a resist film having predetermined film thickness. Incidentally, the prebake processing is intended to evaporate the solvent contained in the applied resist film and form a stable resist film. After that, a 1:1 projection aligner using multiple-wavelength light (g-line, h-line and i-line) of a super high pressure mercury lamp is used to perform a predetermined time of exposure processing by means of a mask having appropriate design patterns. After that, a predetermined time of developing processing is performed with a general-purpose TMAH developing solution (2.38%) which is an organoalkaline developing solution, thereby forming resist patterns (not shown) of predetermined sizes from which to form a semiconductor layer. Subsequently, in order to expose a DNQ photosensitizer which has not reacted and exists in the interior of each of the developed resist patterns (not shown), the developed resist patterns (not shown) are irradiated with light of wavelength between 350 nm and 450 nm which is light within the range of photosensitive wavelengths of the DNQ photosensitizer. In this case, suitable examples of the light of wavelength between 350 nm and 450 nm are g-line (436 nm), h-line (405 nm) and i-line (365 nm) which are spectral lights of the super high pressure mercury lamp, and in Embodiment 4, multiple-wavelength light including g-line (436 nm), h-line (405 nm) and i-line (365 nm) of the super high pressure mercury lamp are irradiated onto the developed resist patterns (not shown).

Incidentally, the reason why multiple-wavelength light is used in Embodiment 4 is that its amount of irradiation is larger compared to single-wavelength light, so that the DNQ photosensitizer existing in the interior of each of the developed resist patterns (not shown) can be exposed within a short time. Then, a predetermined time of bake processing at a temperature not lower than the glass transition temperature of the resist patterns (not shown) is performed so that the resist patterns (not shown) are softened and fluidized, thereby forming resist patterns 504a to 508a of predetermined sizes having sidewall angles reduced through the softening and fluidization of the resist patterns (not shown) (refer to FIG. 5B).

During this time, a large amount of indene carboxylic acid which is a photochemical reaction product from the DNQ photosensitizer is produced in the interior of each of the resist patterns (not shown) after the light irradiation step. Accordingly, the glass transition temperature of the resist patterns (not shown) is decreased, and it is possible to realize a decrease in a bake temperature for obtaining the desired sidewall angles of the resist patterns, which bake temperature is not lower than the glass transition temperature. In the case where the bake temperature is not decreased, the sidewall angles of the resist patterns 504a to 508a can be made smaller owing to the promotion of softening and fluidization. In addition, as the temperature of bake processing is made higher, the sidewall angles of the resist patterns 504a to 508a can be made smaller by softening and fluidization. It is, therefore, necessary that the relationship between the sidewall angles of the resist patterns 504a to 508a and the bake temperature be found in advance and the resist patterns (not shown) be baked at a bake temperature for forming the resist patterns 504a to 508a having the desired sidewall angles. Incidentally, in the case where the resist patterns (not shown) is baked at a temperature not lower than the glass transition temperature, the sidewall angles become rounded, so that the sidewall angles of the resist patterns 504a to 508a become difficult to measure accurately. Accordingly, the profile between a sidewall portion corresponding to a height of 1 μm from the bottom of each of the resist patterns 504a to 508a and the end portion of each of the resist patterns 504a to 508a is linearly approximated, and the angle formed by the obtained approximate straight line and the base substrate 501 is defined as the sidewall angle of each of the resist patterns 504a to 508a. Incidentally, the developing processing, the light irradiation processing and the bake processing at a temperature not lower than the glass transition temperature are performed in the form of continuous processing by a dedicated developing apparatus in which a light irradiation unit is incorporated (refer to FIG. 5B).

Then, with the resist patterns 504a to 508a as masks, the crystalline silicon film 503b and the silicon oxide film (not shown) which is the film formed over the surface of the crystalline silicon film 503b are subjected to dry etching processing, thereby forming island-shaped semiconductor layers 504b to 508b from the crystalline silicon film 503b having a film thickness 50 nm. These island-shaped semiconductor layers 504b to 508b are island-shaped regions which constitute the active layers of TFTs and in which the source regions and the drain regions of TFTs are to be formed later. An RIE type of dry etching apparatus is used for the dry etching processing, and the dry etching processing is performed under the dry etching condition that the gas flow ratio of $CF_4$ to $O_2$ in an etching gas is 50:45, and taper etching processing is performed by a resist-receding method. Accordingly, although illustration is omitted for the sake of convenience, the sidewalls of the respective island-shaped semiconductor layers 504b to 508b each of which is an etched film are formed into forwardly tapered shapes (note: in FIG. 6A, the shape of each of the island-shaped semiconductor layers 504b to 508b is shown as a rectangular shape for the sake of convenience). Incidentally, the reason why the respective island-shaped semiconductor layers 504b to 508b are formed in the forwardly tapered shapes is that the coating properties of a gate insulating film and a gate electrode film to be formed in a later step can be improved in coverage in stepped portions of the semiconductor layers 504b to 508b (refer to FIG. 6A).

Then, resist removing processing which includes an ashing step and a resist removing step is performed on unnecessary resist patterns (not shown) remaining after the dry etching processing. In the resist patterns (not shown) after the dry etching processing, since the reaction of polymers which constitute the resist with the etching gas and the cross-linking reaction of the polymers proceed, and a deteriorated layer difficult to remove is produced on the surface of each of the resist patterns (not shown). The ashing step which is the processing of effecting decomposition into carbon dioxide by means of oxygen plasma is suited to the processing of removing the deteriorated layer, and the resist removing step which is dissolution processing using an organic resist removing solution is suited to the processing of removing the resist patterns (not shown) after the removal of the deteriorated layer. For this reason, in Embodiment 4, after the processing of removing the deteriorated layer by means of the ashing step has been performed, the resist removing step using an organic resist removing solution is performed. Incidentally, the resist patterns (not shown) after the dry etching processing contain a large amount of indene carboxylic acid which is produced by the irradiation of the developed resist patterns with multiple-wavelength light formed of g-line (436 nm), h-line (405 nm) and i-line (365 nm) of the super high pressure mercury lamp. Accordingly, the resist material which is left when the deteriorated layer is removed from the surface portions of the resist patterns (not shown) by ashing is promoted in its solubility in the resist removing solution, whereby it is possible to completely remove the resist material without leaving resist residues, through the resist removing step (refer to FIG. 6A).

Then, a gate insulating film 509 including a silicon oxide film or a silicon oxide nitride film having a film thickness of 30-200 nm, preferably 80-130 nm, is deposited to cover the semiconductor layers 504b to 508b by plasma CVD or reduced-pressure CVD. In Embodiment 4, the gate insulating film 509 including a silicon oxide film having a film thickness of 100 nm is deposited by plasma CVD method. In this step, as a preceding washing, a predetermined time of washing before deposition is performed with dilute hydrofluoric acid in order to remove a natural oxide film (not shown) which adheres to the surfaces of the semiconductor layers 504b to 508b. It is known that the film thickness of the gate insulating film 509 needs to be not smaller than 80 nm so that the gate insulating film 509 can avoid stress from a gate electrode film to be formed in a later step to overlie the gate insulating film 509. The film thickness of the gate insulating film 509 is set in view of this point. (refer to FIG. 6B).

Then, a first-layer gate electrode film 510 including a TaN film having a film thickness of 5-50 nm, preferably 20-40 nm, is deposited by a sputtering method. In Embodiment 4, the first-layer gate electrode film 510 including a TaN film having a film thickness of 30 nm is deposited. After that, a second-layer gate electrode film 511 including a W film having a film thickness of 200-600 nm, preferably 300-500 nm, more preferably 350-500 nm, is deposited by sputtering. In Embodiment 4, the second-layer gate electrode film 511 including a W film having a film thickness of 370 nm is deposited. Incidentally, the film thickness of the TaN film is set in view of both the controllability of the thickness of the TaN film to be left in a taper-shaped region during dry etching and the doping characteristics of doping of an impurity element through the TaN film by a through-doping method. It is known that the film thickness of the W film needs to be not smaller than 340 nm so that the occurrence of a channeling phenomenon in the W film is prevented during doping of an impurity element. The film thickness of the W film is set in view of this point (refer to FIG. 6B).

Then, resist patterns 512a to 517a each including a general-purpose DNQ-novolac resin type of positive resist is formed by a photolithography step to which the developing apparatus capable of performing continuous processing on the resist pattern forming step according to the invention is applied. The resist patterns 512a to 517a are resist patterns to form gate electrodes, electrodes for holding capacitors, source lines and the like, and are formed by a resist pattern forming step which is basically the same as the above-described semiconductor layer forming step. The resist pattern forming step will be described below in brief. Namely, a resist film of predetermined film thickness including a DNQ-novolac resin type of positive resist is formed by spin coating and prebake processing. After that, a 1:1 projection aligner is used to perform a predetermined time of exposure processing by means of a mask having appropriate design patterns. After that, a predetermined time of developing processing is performed with a general-purpose TMAH developing solution (2.38%), thereby forming resist patterns (not shown) of predetermined sizes to form gate electrodes, electrodes for holding capacitors, source lines and the like. Then, the developed resist patterns (not shown) are irradiated with light of wavelength between 350 nm and 450 nm which are lights within the range of photosensitive wavelength of a DNQ photosensitizer. In this case, in Embodiment 4, multiple-wavelength light including g-line (436 nm), h-line (405 nm) and i-line (365 nm) of a super high pressure mercury lamp is irradiated onto the developed resist patterns (not shown). Then, a predetermined time of bake processing at a temperature not lower than the glass transition temperature of the resist patterns (not shown) is performed so that the resist patterns (not shown) are softened and fluidized, thereby forming the resist patterns 512a to 517a of predetermined sizes, which have the desired sidewall angles, respectively. Incidentally, the developing processing, the light irradiation processing and the bake processing at a temperature not lower than the glass transition temperature are performed in the form of continuous processing by a dedicated developing apparatus in which a light irradiation unit for irradiating light within the range of photosensitive wavelength between 350 nm and 450 nm (refer to FIG. 7A).

Then, a metal stacked film which includes the first-layer gate electrode film 510 including a TaN film having a film thickness of 30 nm and the second-layer gate electrode film 511 including a W film having a film thickness of 370 nm are subjected to dry etching processing using the resist patterns 512a to 517a as masks. In the dry etching processing, a high-density plasma type of ICP dry etching apparatus (the name of the apparatus: E645) which is made by Matsushita Electric Industrial, Co. Ltd. is used, and three-step dry etching processing which is composite etching processing including taper etching processing and anisotropic etching processing is performed, thereby forming gate electrodes each having predetermined size, which respectively include first-layer gate electrode 512c to 515c and second-layer gate electrodes 512b to 515b, and, at the same time, forming a electrode for a holding capacitor of predetermined size which includes a first-layer holding capacitor electrode 516c and a second-layer holding capacitor electrode 516b, and a source line electrode of predetermined size which includes a first-layer source line electrode 517c and a second-layer source line electrode 517b. In the dry etching processing, the sizes along the channel direction of the second-layer electrodes 512b to 517b (a generic term for the second-layer gate electrodes 512b to 515b, the second-layer holding capacitor electrode 516b and the second-layer source line electrode 517b) are shorter than those of the first-layer electrodes 512c to 517c (a generic term for the first-layer gate electrode 512c to 515c, the first-layer holding capacitor electrode 516c and the first-layer source line electrode 517c). The portions of the first-layer electrodes 512c to 517c that respectively correspond to regions exposed from the second-layer electrodes 512b to 517b are formed into tapered shapes so that the portions become gradually smaller in film thickness toward their respective edges. It is possible to make the sidewall angles of resist patterns 512a to 517a further smaller as compared with general resist patterns through bake processing at a temperature not lower than the glass transition temperature owing to the action of a decrease in the glass transition temperature of the resist patterns 512a to 517a. Accordingly, in the three-step dry etching step, the tapered regions of the first-layer electrodes 512c to 517c that respectively correspond to the regions exposed from the second-layer electrodes 512b to 517b can be formed to have far longer sizes, respectively. Incidentally, the shape shrinkage (not shown) of each of the resist patterns 512a to 517a proceeds owing to a resist-receding phenomenon during the drying etching, while the thickness of the gate insulating film 509 is reduced in the regions exposed from the first-layer electrodes 512c to 517c and is deformed into the shape of a gate insulating film 518 (refer to FIG. 7B).

Specific processing of the dry etching processing including these three steps is as follows. Namely, the first step of dry etching processing is performed to taper-etch only the second-layer gate electrode film 511 including the W film. The dry etching conditions for this taper etching processing are as follows: the flow rate of $CF_4$, $Cl_2$ and $O_2$ in a mixed gas thereof are 25 sccm ($CF_4$), 25 sccm ($Cl_2$) and 10 sccm ($O_2$); ICP power is 500 W (ICP power density: 1.019 W/cm$^2$); bias power is 150 W (bias power density: 0.96 W/cm$^2$); and gas pressure is 1.0 Pa, and dry etching processing is performed with an etching time determined by adding the time of 10% overetching to the time of just etching (generally, approximately 120 seconds). The second step of dry etching processing is performed to anisotropically etch the first-layer gate electrode film (TaN film) 510 by using as a mask the second-layer electrodes (W film) (not shown) formed by the first step of dry etching processing. The dry etching conditions for this anisotropic etching processing are as follows: the flow rate of $CF_4$ and $Cl_2$ in a mixed gas thereof are 30 sccm ($CF_4$) and 30 sccm ($Cl_2$); ICP power is 500 W (ICP power density: 1.019 W/cm$^2$); bias power is 10 W (bias power density: 0.064 W/cm$^2$); and gas pressure is 1.0 Pa, and dry etching processing is performed with a dry etching time determined by adding 15 seconds of overetching to the time of just etching (generally, approximately 45 seconds). The third step of dry etching processing is performed to anisotropically etch the second-layer gate electrodes (not shown) by using as a mask the resist patterns (not shown) whose resist pattern shapes are shrunk and receded through the first and second steps of dry etching processing, thereby forming the second-layer electrodes 512b to 517b each having a shape close to a rectangle and the first-layer electrodes 512c to 517c each having a forwardly tapered shape so that the portions of the first-layer electrodes 512c to 517c that correspond to the regions exposed from the respective second-layer electrodes 512b to 517b become gradually smaller in film thickness toward their respective edges. The etching conditions for this anisotropic etching processing are as follows: the flow rate of $CF_6$, $Cl_2$ and $O_2$ in the mixed gas thereof are 24 sccm ($CF_4$), 12 sccm ($Cl_2$) and 24 sccm ($O_2$); ICP power is 700 W (ICP power density: 1.427 W/cm$^2$); bias power is 4 W (bias power density: 0.026 W/cm$^2$); and gas pressure is 1.3 Pa, and dry etching processing is performed with a fixed dry etching time of 25 seconds (refer to FIG. 7B).

Then, resist removing processing which includes an ashing step and a resist removing step is performed on unnecessary resist patterns (not shown) remaining after the dry etching processing. In the resist patterns (not shown) after the dry etching processing, a deteriorated layer difficult to remove is produced on the surface of each of the resist patterns (not shown). The ashing step is suited to the processing of removing the deteriorated layer, and the resist removing step is suited to the processing of removing the resist patterns (not shown) after the removal of the deteriorated layer. For this reason, in Embodiment 4, after the processing of removing the deteriorated layer by means of the ashing step has been performed, the resist removing step using a resist removing solution is performed. Incidentally, the resist patterns (not shown) after the dry etching processing contain a large amount of indene carboxylic acid which is produced by the irradiation of the developed resist patterns with multiple-wavelength lights including g-line (436 nm), h-line (405 nm) and i-line (365 nm) of a super high pressure mercury lamp. Accordingly, the resist material which is left when the deteriorated layer is removed from the surface portions of the resist patterns (not shown) by ashing is promoted in its solubility in the resist removing solution, whereby it is possible to completely remove the resist material without leaving resist residues, through the resist removing step (refer to FIG. 7B).

Then, as the second doping processing, the ion doping apparatus is used to dope a low dose of n-type impurity including P (phosphorus) element by using the first-layer electrode 512c to 516c as masks. Through the second doping processing, lightly doped n-type impurity regions (n$^{--}$ regions) 519 to 523 are respectively formed in the portions of semiconductor layers 504b to 508b that respectively correspond to the outside regions of the first-layer electrodes 512c to 516c. In this case, for the formation of the lightly doped n-type impurity regions (n$^{--}$ regions) 519 to 523, doping is performed via the overlying gate insulating film 518 by a so-called through-doping method. Incidentally, as doping conditions, it is possible to use the condition that a phosphine ($PH_3$)/hydrogen ($H_2$) gas in which phosphine ($PH_3$) is diluted with hydrogen ($H_2$) to a dilution ratio of 3-20% is used as an ion source and doping is performed at an acceleration voltage of 30-90 kV with a dose of $6\times10^{12}$ to $1.5\times10^{14}$ atoms/cm$^2$. In Embodiment 4, a phosphine ($PH_3$)/hydrogen ($H_2$) gas in which phosphine ($PH_3$) is diluted with hydrogen ($H_2$) to a dilution ratio of 5% is used as an ion source and doping is performed at an acceleration voltage of 50 kV with a dose of $3\times10^{13}$ atoms/cm$^2$ (refer to FIG. 8A).

Then, resist patterns 524 and 525 which serve as masks for doping an impurity are formed through general photolithography processing. The resist patterns 524 and 525 are respectively formed in a region in which a p-channel type TFT 602 which constitutes part of a GOLD-structure driver circuit 606 is fabricated, and in a region in which a LDD-structure pixel TFT 604 is fabricated, but are not formed in regions in which n-channel type TFTs 601 and 603 which constitute part of a GOLD-structure driver circuit 606 and a holding capacitor 605 are fabricated. In this case, in the region in which the GOLD-structure p-channel type TFT 602 is fabricated, the resist pattern 524 is formed so that the edge portion of the resist pattern 524 is positioned outside the semiconductor layer 505b, i.e., the resist pattern 524 completely covers the semiconductor layer 505b. In the region in which the LDD-structure pixel TFT 604 is fabricated, the resist pattern 525 is formed so that the edge portion of the resist pattern 525 is positioned inside the semiconductor layer 507b and at a predetermined distance outwardly from the first-layer gate electrode 515c, i.e., the edge portion of the resist pattern 525 is positioned outwardly from the edge portion of the first-layer gate electrode 515c by the size of a Loff region (which will be described in detail in connection with a later step) (refer to FIG. 8B).

Then, as the third doping processing, the ion doping apparatus is used to dope a high dose of n-type impurity including P element by using the resist patterns 524 and 525 as masks. In this case, in the regions in which the n-channel type TFTs 601 and 603 which constitute part of the GOLD-structure driver circuit 606 are formed, the lightly doped n-type impurity regions (n$^{--}$ regions) 519 and 521 are respectively already formed in the portions of the semiconductor layers 504b and 506b that respectively correspond to the outside regions of the first-layer electrode 512c and 514c, and heavily doped n-type impurity regions (n$^+$ regions) 526 and 528 are formed by doping from above the n-type impurity regions (n$^{--}$ regions) 519 and 521, and at the same time, lightly doped n-type impurity regions (n$^{--}$ regions) 527 and 529 are respectively formed in the semiconductor layers 504b and 506b that respectively correspond to the regions of the first-layer gate electrodes 512c and 514c that are exposed from the second-layer gate electrodes 512b and 514b. Each of the heavily doped n-type impurity regions (n$^+$ regions) 526 and 528 formed in this manner has the function of the source region or the drain region of the GOLD structure, while each of the lightly doped n-type impurity regions (n$^-$ regions) 527 and 529 has the function of a field relaxing region which is the $L_{ov}$ region (a field relaxing region which overlaps a gate electrode) of the GOLD structure. Similarly, in a region in which the holding capacitor 605 is fabricated, a heavily doped n-type impurity region (n$^+$ region) 532 and a lightly doped n-type impurity region (n$^-$ region) 533 are formed. Each of the heavily doped n-type impurity region (n$^+$ region) 532 and the lightly doped n-type impurity region (n$^-$ region) 533 which are formed in this step has the function of one of capacitor forming electrodes because the regions 532 and 533 are formed in the region in which not a TFT but the holding capacitor 605 is formed (refer to FIG. 8B).

In the region in which the LDD-structure pixel TFT 604 is fabricated, through the third doping processing, a heavily doped n-type impurity region (n$^+$ region) 530 is formed in the portion of the semiconductor layer 507b that corresponds to the outside of the resist pattern 525. In the semiconductor layer 507b, the lightly doped n-type impurity region (n$^-$ region) 522 is already formed, and when the heavily doped n-type impurity region (n$^+$ region) 530 is formed, the lightly doped n-type impurity region (n$^-$ region) 522 is divided into the heavily doped n-type impurity region (n$^+$ region) 530 and a resultant lightly doped n-type impurity region (n$^-$ region) 531. The heavily doped n-type impurity region (n$^+$ region) 530 formed in this manner has the function of the source region or the drain region of the LDD structure, while the lightly doped n-type impurity region (n$^-$ region) 531 has the function of a field relaxing region which is the Loff region (a field relaxing region which does not overlap a gate electrode) of the LDD structure. Incidentally, the term "Loff region" used herein means the field relaxing region of the LDD structure that does not overlap a gate electrode. As doping conditions for this doping processing, it is possible to use the condition that a phosphine ($PH_3$)/hydrogen ($H_2$) gas in which phosphine ($PH_3$) is diluted with hydrogen ($H_2$) to a dilution ratio of 3-20% is used as an ion source and doping is performed at an acceleration voltage of 30-90 kV with a dose of $6\times10^{14}$ to $1.5\times10^{16}$ atoms/cm². In Embodiment 4, a phosphine ($PH_3$)/hydrogen ($H_2$) gas in which phosphine ($PH_3$) is diluted with hydrogen ($H_2$) to a dilution ratio of 5% is used as an ion source and doping is performed at an acceleration voltage of 65 kV with a dose of $3\times10^{15}$ atoms/cm² (refer to FIG. 8B).

The heavily doped impurity regions ($n^+$ regions) 526, 528, 530 and 532 and the lightly doped impurity regions ($n^-$ regions) 527, 529 and 533 are formed by a so-called through-doping method of performing doping via an overlying film. The term through-doping method means a doping method of doping an impurity into an objective doping layer via an overlying film, and is characterized in that the concentration of the impurity in the doping layer can be varied depending on the characteristic and the thickness of the overlying film. Accordingly, although the impurity is doped under the same doping conditions, it is possible to form the heavily doped impurity regions ($n^+$ regions) 526, 528, 530 and 532 in regions which underlies a film including the gate insulating film 518 having a inferior ion blocking capability, and at the same time, it is possible to form the lightly doped impurity regions ($n^-$ regions) 527, 529 and 533 in regions which underlies a stacked film having a superior ion block capability, which stacked film includes the first-layer gate electrode (TaN films) 512c, 514c and 516c and the gate insulating film 518 (refer to FIG. 8B).

Incidentally, in the regions where n-channel type TFTs 601 and 603 which constitute part of the GOLD-structure driver circuit 606 are formed, when the heavily doped impurity regions ($n^+$ regions) 526 and 528 and the lightly doped impurity regions ($n^-$ regions) 527 and 529, the channel forming regions of the TFTs are respectively defined in the regions which exist in the semiconductor layers 504b and 506b and overlap the respective second-layer gate electrodes 512b and 514b. Similarly, in the region in which the LDD-structure pixel TFT 604 is fabricated, the channel forming region of the TFT is defined in the region that exists in the semiconductor layer 507b and overlaps the first-layer gate electrode 515c (refer to FIG. 8B).

Then, resist removing processing which includes an ashing step and a resist removing step is performed to remove the unnecessary resist patterns 524 and 525 remaining after the doping processing. The resist patterns 524 and 525 are formed by patterning using a general photolithography process, and particularly after the doping processing, the resist patterns 524 and 525 become difficult to remove resist. To cope with this point, the time of the ashing step which is oxygen plasma processing is prolonged. After that, resist patterns 534 to 536 which serve as masks for doping an impurity are formed through general photolithography processing. The resist patterns 534 to 536 are formed to open the region in which the p-channel type TFT 602 which constitutes part of the GOLD-structure driver circuit 606 is fabricated and the region in which the holding capacitor 605 is fabricated (refer to FIG. 9A).

Then, as the fourth doping processing, the ion doping apparatus is used to dope a high dose of p-type impurity including B element by a through-doping method, which is a fourth doping processing. Through the fourth doping processing, in the region in which the p-channel type TFT 602 which constitutes part of the GOLD-structure driver circuit 606 is fabricated, a heavily doped p-type impurity region ($p^+$ region) 537 is formed in the portion of the semiconductor layer 505b that corresponds to the outside of the first-layer gate electrode 513c. At the same time, a lightly doped p-type impurity region ($p^-$ region) 538 is formed in the portion of the semiconductor layer 505b that corresponds to the region of the first-layer gate electrode 513c that is exposed from the second-layer gate electrode 513b. The heavily doped impurity region ($p^+$ region) 537 formed in this manner has the function of the source region or the drain region of the GOLD structure, while the lightly doped impurity region ($p^-$ region) 538 has the function of a field relaxing region which is the $L_{ov}$ region (a field relaxing region which overlaps a gate electrode) of the GOLD structure. Similarly, in a region in which the holding capacitor 605 is fabricated, a heavily doped impurity region ($p^+$ region) 539 and a lightly doped impurity region ($p^-$ region) 540 are formed, each of which functions as one of capacitor forming electrodes (refer to FIG. 9A).

In the heavily doped p-type impurity region ($p^+$ region) 537 in the region in which the p-channel type TFT 602 is fabricated, the lightly doped n-type impurity region ($n^{--}$ region) 520 is already formed, but since doping is performed with the dose of p-type impurity that is higher than that of n-type impurity, the heavily doped impurity region ($p^+$ region) 537 having a p-conductivity type as a whole is formed. In the region in which the holding capacitor 605 is fabricated, the heavily doped n-type impurity region ($n^+$ region) 532 and the lightly doped n-type impurity region ($n^-$ region) 533 are already formed, but since doping is performed with the dose of p-type impurity that is higher than that of n-type impurity, the heavily doped impurity region ($p^+$ region) 539 and the lightly doped impurity region ($p^-$ region) 540 each having a p-conductivity type as a whole are formed. Incidentally, the heavily doped p-type impurity regions ($p^+$ regions) 537 and 539 and the lightly doped p-type impurity regions ($p^-$ regions) 538 and 540 are formed at the same time by a through-doping method using the difference between the characteristics or the film thicknesses of overlying films, similarly to the case of the n-type impurity regions. As doping conditions for this doping processing, it is possible to use the condition that a diborane ($B_2H_6$)/hydrogen ($H_2$) gas in which diborane ($B_2H_6$) is diluted with hydrogen ($H_2$) to a dilution ratio of 3-20% is used as an ion source and doping is performed at an acceleration voltage of 60-100 kV with a dose of $4\times10^{15}$ to $1\times10^{17}$ ions/cm². In Embodiment 4, a diborane ($B_2H_6$)/hydrogen ($H_2$) gas in which diborane ($B_2H_6$) is diluted with hydrogen ($H_2$) to a dilution ratio of 5% is used as an ion source and doping is performed at an acceleration voltage of 80 kV with a dose of $2\times10^{16}$ ions/cm² (refer to FIG. 9A).

Then, resist removing processing which includes an ashing step and a resist removing step is performed to remove the unnecessary resist patterns 534 to 536 remaining after the doping processing. The resist patterns 534 to 536 are formed by patterning using a general photolithography process, and particularly after the doping processing, the resist patterns 534 to 536 become difficult to remove resist. To cope with this point, the time of the ashing step which is oxygen plasma processing is prolonged. After that, a first interlayer insulating film 541 including a silicon nitride film or a silicon oxide nitride film having a film thickness of 50-300 nm, preferably 100-200 nm, is deposited by plasma CVD. In Embodiment 4, the first interlayer insulating film 541 including a silicon nitride film having a film thickness of 150 nm is deposited by plasma CVD. Subsequently, twelve hours of thermal processing at 600° C. in a furnace is performed for the purpose of thermal activation of the n-type impurity (P element) or the p-type impurity (B element) doped into the semiconductor layers 504b to 508b. The thermal activation is performed for the thermal activation processing of the n-type or p-type impurity, but also has the purpose of gettering a catalyst element (Ni element) present in channel forming regions positioned immediately below the respective gate electrodes, by means of the impurity. Incidentally, the thermal activation processing may be performed before the deposition of the first interlayer insulating film 541, but in the case where the wiring materials of the gate electrodes and the like are weak in heat resistance, it is preferable to perform the thermal activation processing after the deposition of the first interlayer insulating film 541. Subsequently to the thermal activation processing, one hour of hydrogenation processing at 410° C. is performed in a nitrogen atmosphere containing 3% hydrogen in order to terminate the dangling bonds of the semiconductor layers 504b to 508b (refer to FIG. 9B).

A second interlayer insulating film 542 including an acrylic resin film having a film thickness of 0.7 to 3 μm, preferably 1 to 2 μm, is formed over the first interlayer insulating film 541. In Embodiment 4, the second interlayer insulating film 542 including an acrylic resin film having a film thickness of 1.6 μm is formed. The acrylic resin film is formed by applying an acrylic resin by spin coating and thermally processing the acrylic resin film in a bake oven. After that, contact holes 543 of predetermined sizes are formed in the second interlayer insulating film 542 including the acrylic resin film, by dry etching processing using general photolithography processing and oxygen plasma (exactly, containing 5% $CF_4$). In this step, the contact holes 543 are formed to be connected to the heavily doped n-type impurity regions ($n^+$ regions) 526, 528 and 530 and the heavily doped p-type impurity regions ($p^+$ regions) 537 and 539, and further, to a source line electrode 517bc (including the first-layer source line electrode 517c and the second-layer source line electrode 517b) which functions as a source line. Incidentally, the resist patterns (not shown) after the dry etching processing are only partly left by being corroded in the course of the dry etching processing of the acrylic resin film with oxygen plasma (exactly, containing 5% $CF_4$), and the removal of the remaining resist patterns (not shown) is performed with resist removing processing (refer to FIG. 10A).

Then, for washing before sputtering, the surfaces of the semiconductor layers 504b to 508b including the crystalline silicon film 503b, which surfaces are exposed at the bottoms of the contact holes 543, are washed with dilute hydrofluoric acid. After that, a metal stacked film (not shown) formed of a three-layer film of Ti (100 nm)/Al (350 nm)/Ti (100 nm) is deposited by sputtering. Incidentally, in the metal stacked film, the first-layer Ti film having a film thickness of 100 nm is deposited for the purpose of lowering contact resistance and preventing mutual diffusion of silicon and aluminum, and the third-layer Ti film having a film thickness of 100 nm is deposited for the purpose of preventing the occurrence of hillocks on the surfaces of aluminum lines. After the deposition of the metal stacked film, resist patterns (not shown) to form lines of predetermined sizes are formed over the metal stacked film by general photolithography processing (refer to FIG. 10B).

Then, dry etching processing using a chlorine-based etching gas is performed so that metal stacked film lines of predetermined size 544 to 549, connection electrodes 550, 552 and 553 and a gate line 551 are formed at the same time. The metal stacked film lines 544 to 549 are formed to be electrically connected to the heavily doped impurity regions ($n^+$ regions) 526 and 528 of the driver circuit 606 and to the heavily doped impurity region ($p^+$ region) 537. The connection electrode 550 is formed to electrically connect the heavily doped impurity region ($n^+$ region) 530 of the pixel TFT 604 and the second-layer source line electrode 517b which functions as a source line. The connection electrode 552 is formed to be electrically connected to the heavily doped impurity region ($n^+$ region) 530 of the pixel TFT 604, and the connection electrode 553 is formed to be electrically connected to the heavily doped impurity region ($p^+$ region) 539 of the holding capacitor 605. The gate line 551 is formed to electrically connect a plurality of second-layer gate electrodes 515b of the pixel TFT 604. Incidentally, since an organic acrylic resin film is applied to the second interlayer insulating film 542, an ashing step cannot be introduced into resist removing processing, and the processing of removing resist patterns (not shown) is performed with only a resist removing step (refer to FIG. 10B).

Then, an ITO (Indium-Tin-Oxide) film having a film thickness of 80-130 nm, preferably 100-120 nm, is deposited by sputtering. In Embodiment 4, an ITO film having a film thickness of 110 nm is deposited by sputtering. After that, resist patterns (not shown) to form pixel electrodes of predetermined sizes are formed by general photolithography processing. Subsequently, wet etching processing is performed with an etching solution such as ITO-04N (tradename) made by KANTO KAGAKU. Through the wet etching processing, a pixel electrode 554 of predetermined size which includes the ITO film is formed to be connected to the connection electrodes 552 and 553. The pixel electrode 554 is electrically connected via the connection electrode 552 to the heavily doped impurity region ($n^+$ region) 530 which functions as the source region or the drain region of the pixel TFT 604. The pixel electrode 554 is further electrically connected to the heavily doped impurity region ($p^+$ region) 539 of the holding capacitor 605 via the connection electrode 553. Then, resist removing processing which includes a resist removing step is performed on unnecessary resist patterns (not shown) remaining after the wet etching processing. Incidentally, since the organic acrylic resin film is applied to the second interlayer insulating film 542, an ashing step cannot be introduced into the resist removing processing, and the processing of removing resist patterns (not shown) is performed with only the resist removing step (refer to FIG. 10B.

As is apparent from the above description, in the case where the developing apparatus capable of performing continuous processing on the resist pattern forming process according to the invention is applied to the process of fabricating the active matrix type liquid crystal display device, it is possible to achieve the following specific effects and advantages. By irradiating the semiconductor layer forming resist patterns and the resist patterns for forming electrodes such as gate electrodes with light of wavelength between 350 nm and 450 nm which is light within the range of photosensitive wavelength of the DNQ photosensitizer, it is possible to decrease the glass transition temperature of these resist patterns, it is possible to realize a decrease in a bake temperature for obtaining the desired sidewall angles of the resist patterns. In the case where the bake temperature is not decreased, the sidewall angles of the resist patterns can be made smaller owing to the promotion of softening and fluidization. Accordingly, the tapered region of each of electrode patterns such as a semiconductor layer and gate electrodes which are etched patterns can be controlled to have a far longer size. This fact is particularly advantageous in the step of forming GOLD-structure gate electrodes, and the $L_{ov}$ regions of the GOLD-structure gate electrodes can be controlled to have far larger sizes. Accordingly, Embodiment 4 is advantageous for improving a process margin for TFT characteristics. In addition, in the processing of removing resist patterns after dry etching processing, it is possible to completely remove resist patterns without leaving resist residues, through an ashing step and a resist removing step. Accordingly, Embodiment 4 is advantageous for improving the quality of semiconductor devices. Incidentally, although the process of fabricating an active matrix type liquid crystal display device has been specifically described in connection with Embodiment 4, it goes without saying that Embodiment 4 can also be applied to the process of fabricating an active matrix type EL display device.

Embodiment 5

In this embodiment mode, specific examples of electronic apparatus with built-in display devices formed by applying a resist patterning formation method and a developing device are described. An active matrix type liquid crystal display device and an EL display device are included in aforesaid display device, and applied to display units of various electronic apparatus. In this embodiment mode, a specific example of electronic apparatus in which a display device is applied to a display unit is described with reference to FIGS. 14 to 16.

Examples of electronic apparatus in which the display device is applied to the display unit include a video camera, a digital camera, a projector (rear type or front type), a head mounted display (a goggle type display), a game machine, a car navigation, a personal computer, and a portable information terminal (a mobile computer, a cellular phone, an electronic book, or the like).

Figure 14A:
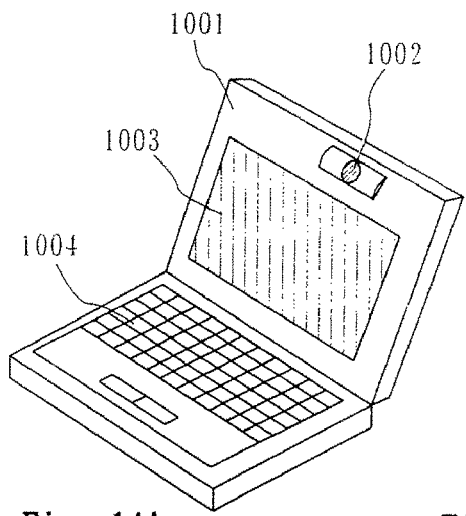
FIGS. 14A to 14F are schematic views showing examples of electronic equipments in which display devices are incorporated.

FIG. 14A shows a personal computer, which is constituted by a main body 1001, an image input unit 1002, a display device 1003, and a key board 1004. The display device of the present invention can be applied to the display device 1003 and another circuits.

Figure 14B:
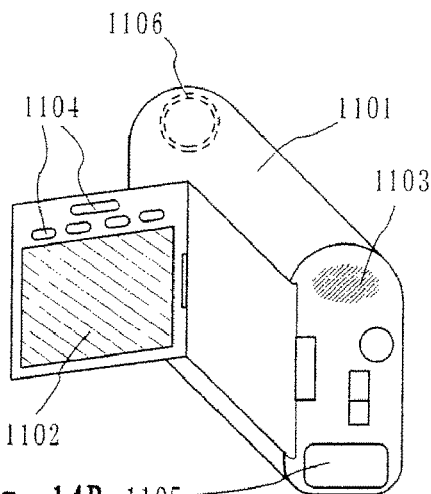

FIG. 14B shows a video camera, which is constituted by a main body 1101, a display device 1102, a sound input unit 1103, an operation switch 1104, a battery 1105, and an image receiving unit 1106. The display device of the present invention can be applied to the display device 1102 and another circuits.

Figure 14C:
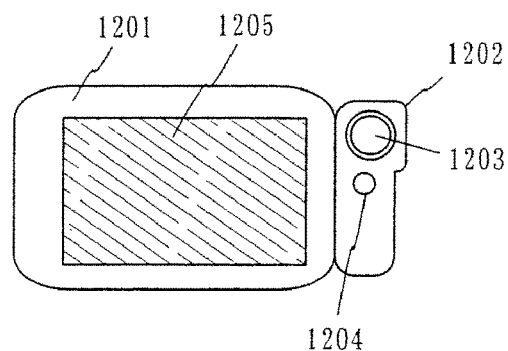

FIG. 14C shows a mobile computer, which is constituted by a main body 1201, a camera unit 1202, an image receiving unit 1203, an operation switch 1204, and a display device 1205. The display device of the present invention can be applied to the display device 1205 and another circuits.

Figure 14D:
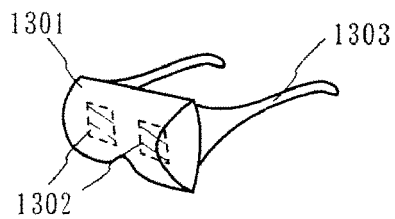

FIG. 14D shows a goggle-type display, which is constituted by a main body 1301, a display device 1302, and an arm unit 1303. The display device of the present invention can be applied to the display device 1302 and another circuits.

Figure 14E:
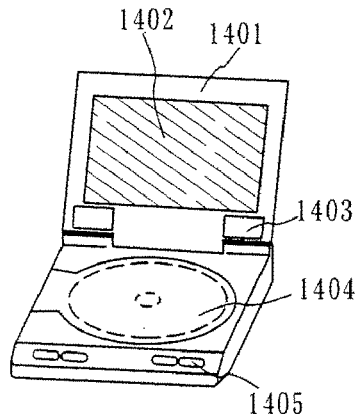

FIG. 14E shows a player using a recording medium in which a program is recorded (hereinafter, recording medium), which is constituted by a main body 1401, a display device 1402, a speaker unit 1403, a recording medium 1404, an operation switch 1405. Here, in this player, employed as the recording medium is a DVD (digital versatile disc), a CD, or the like. Through this, appreciation of music, a game, or an Internet can be attained. The display device of the present invention can be applied to the display device 1402 and another circuits.

Figure 14F:
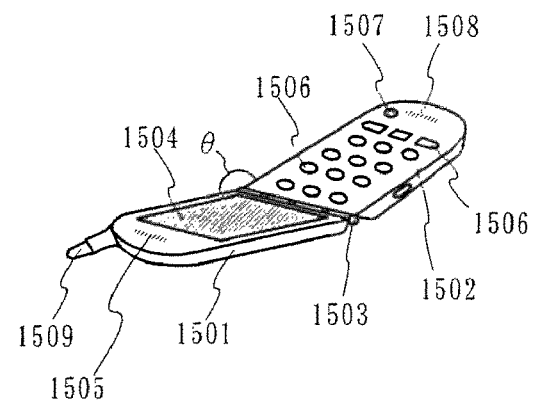

FIG. 14F is a cellular phone, which is constituted by a display panel 1501, an operation panel 1502, a connecting unit 1503, a display unit 1504, a sound output unit 1505, an operation key 1506, a power switch 1507, a sound input unit 1508, and an antenna 1509. The display panel 1501 and the operation panel 1502 are connected each other at the connecting unit 1503. The angle θ between the surface of the display panel 1501 providing display unit 1504 and the surface of the operation panel 1502 providing operation key 1506 can be changed arbitrarily in the connecting unit 1503. The display device of the present invention can be applied to the display device 1504. (See FIG. 14)

Figure 15A:
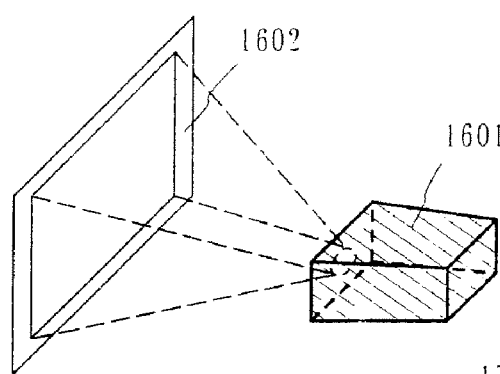
FIGS. 15A to 15D are schematic views showing examples of electronic equipments in which display devices are incorporated.

FIG. 15A shows a front-type projector, which is constituted by a light source optical system and display device 1601 and a screen 1602. The display device of the present invention can be applied to the display device 1601 and another circuits.

Figure 15B:
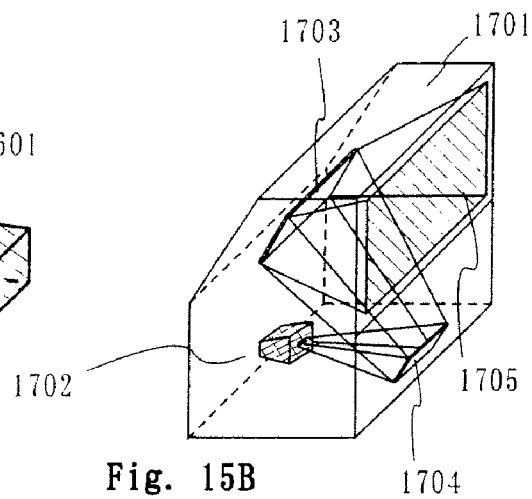

FIG. 15B shows a rear-type projector, which is constituted by a main body 1701, a light source optical system and display device 1702, mirrors 1703, 1704, a screen 1705. The display device of the present invention can be applied to the display device 1702 and another circuits.

Figure 15C:
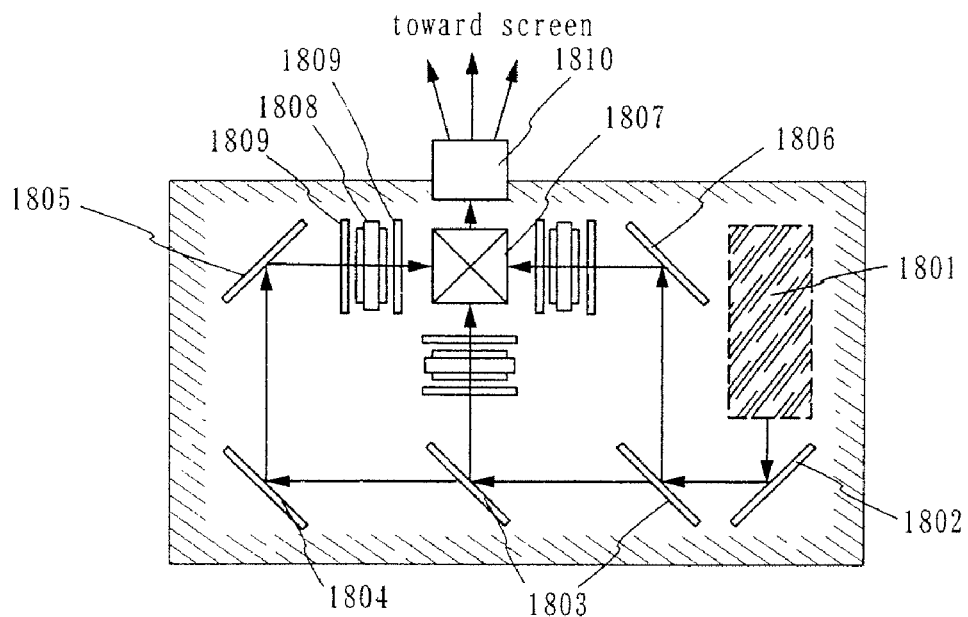

FIG. 15C shows one example of the structure of a light source optical system and display device 1601 shown in FIG. 15A, and a light source optical system and display device 1702 shown in FIG. 15B. Each the light source optical system and the display device 1601 and the light source optical system and the display device 1702 is made of a light source optical system 1801, mirrors 1802 and 1804 to 1806, a dichroic mirror 1803, a prism 1807, a liquid crystal display device 1808, a phase difference plate 1809 and a projection optical system 1810. The projection optical system 1810 is made of a plurality of optical lenses including a projection lens. The structure is referred to as a three-plate type, since three display devices 1808 are used. In addition, an optical lens, a film having a polarization function, a film for adjusting phase difference or an IR film may be appropriately disposed in the path indicated by arrows in FIG. 15C.

Figure 15D:
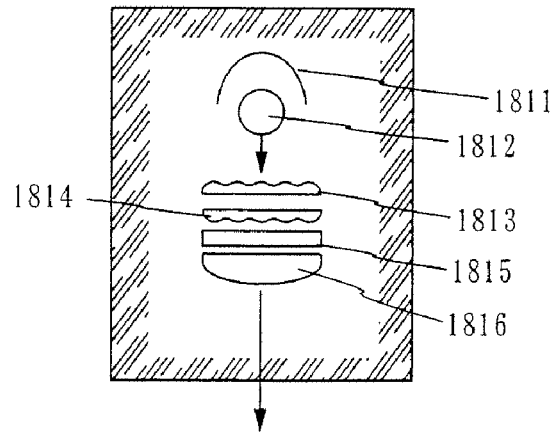

FIG. 15D shows an example of structure of a light source optical system 1801 illustrated in FIG. 15C. In the embodiment, the light source optical system 1801 includes a reflector 1811, a light source 1812, lens arrays 1813 and 1814, a polarization conversion element 1815 and a condenser lens 1816. The light source optical system 1801 shown in FIG. 15D is illustrative only, it is needless to say that there is no particular limitation. For example, it is possible to additionally provide for the light source optical system 1801 such as an optical lens, a film having polarization function, a film adjusting phase difference and an IR film may be properly provided in the light source optical system. (See FIG. 15)

Figure 16A:
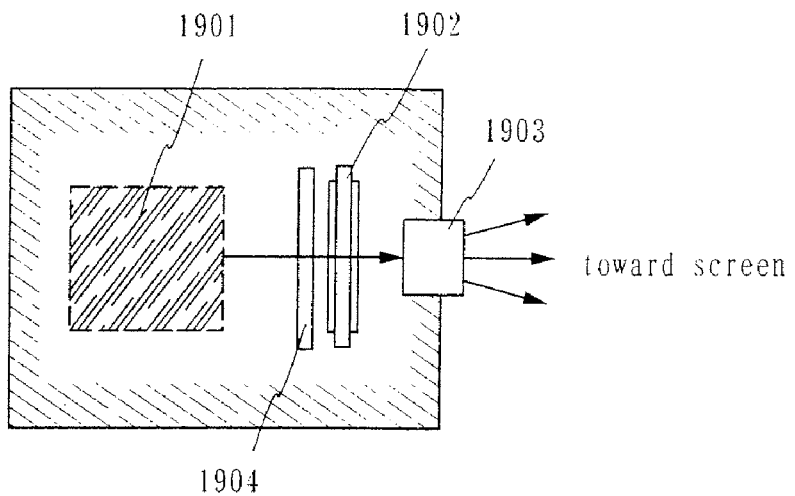
FIGS. 16A to 16C are schematic views showing examples of electronic equipments in which display devices are incorporated.

FIG. 16A shows an example of a single plate system. A light source optical system and a display device shown in FIG. 16 is constituted by a light source optical system 1901, a display device 1902, a projection optical system 1903, and a phase different plate 1904. The projection optical system 1903 is made of a plurality of optical lenses including a projection lens. The light source optical system and the display device shown in FIG. 16A can be applied to the light source optical system and the display device 1601 shown in FIG. 15A and the light source optical system and display device 1702 of FIG. 15B. The light source optical system shown in FIG. 15D may be used for the light source optical system 1902. A color filter (not shown) is provided with the display device 1902 to achieve the color video display.

Figure 16B:
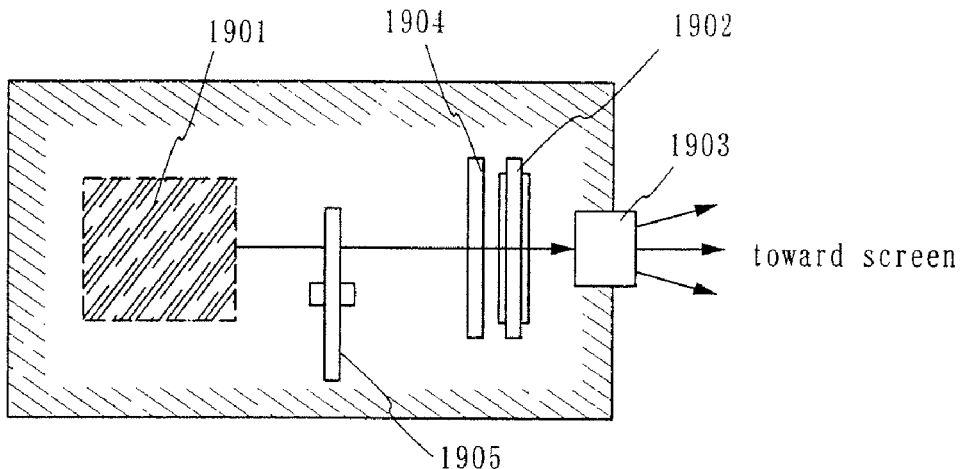
Figure 16C:
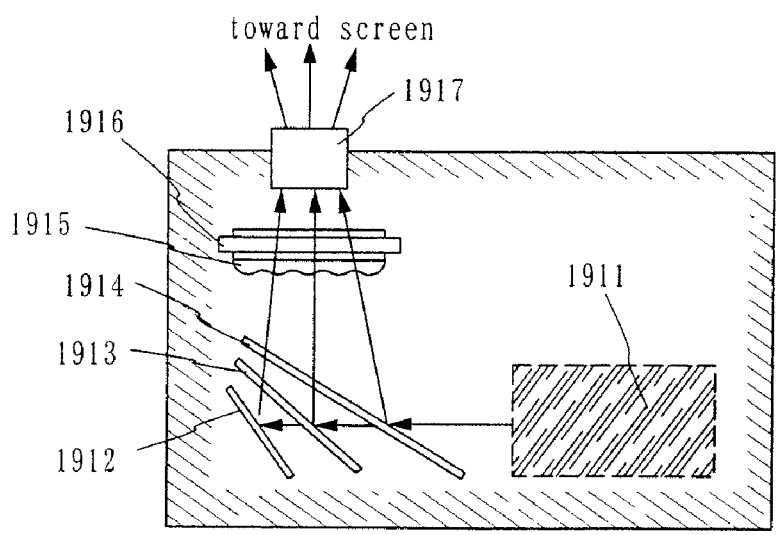

The light source optical system and display device shown in FIG. 16B is an application of that shown in FIG. 16A, to which a rotation color filter disc 1905 of RGB is applied to achieve the color video display instead of additionally arranging the color filter. The light source optical system and display device shown in FIG. 16B is applicable to the light source optical system and display device 1601 of FIG. 15A and the light source optical system and display device 1702 of FIG. 15B. The light source optical system and display device shown in FIG. 16C is referred to as a color-filterless single plate system. In this system, a microlens array 1915 is additionally provided in a display device 1916, to which a dichroic mirror (green) 1912, a dichroic mirror (red) 1913, and a dichroic mirror (blue) 1914 are applied to achieve the color video display. A projection optical system 1917 is composed of a plurality of optical lenses provided with a projection lens.

The light source optical system and display device shown in the figure is applicable to the light source optical system and display device 1601 of FIG. 15A and the light source optical system and display device 1702 of FIG. 15B. Also, an optical system using a coupling lens and a collimator lens in addition to the light source may be applied to a light source optical system 1911. (See FIG. 16)

As described above, the present invention can be implemented in an extremely wide application range thereof and applied to various electronic devices incorporating the display device such as an active matrix liquid crystal display device or an EL display device.

A first advantage is that it is possible to compatibly realize both the formation of a resist pattern having the desired sidewall angle and resist removability, whereby it is possible to improve the process margin of a taper etching step based on a resist-receding method.

A second advantage is that owing to a decrease in the glass transition temperature of a resist pattern, it is possible to promote the softening and fluidization of the resist pattern during bake processing at a temperature not lower than the glass transition temperature. Accordingly, since, in the step of forming the gate electrodes of GOLD-structure TFTs, the $L_{ov}$ regions of the GOLD-structure TFTs can be controlled to have far larger sizes, the invention is advantageous for improving a process margin for TFT characteristics.

A third advantage is that since, in the step of forming the gate electrodes of GOLD-structure TFTs, the $L_{ov}$ regions of the GOLD-structure TFTs can be controlled to have far larger sizes, the invention is advantageous for stabilizing TFT characteristics.

A fourth advantage is that since in the processing of removing a resist pattern after dry etching processing, it is possible to completely remove the resist pattern without leaving resist residues, through an ashing step and a resist removing step, the invention is advantageous for improving the quality and the yield of semiconductor layers.

A fifth advantage is that by applying a developing apparatus according to the invention, it is possible to increase the throughput of a resist pattern forming step while maintaining the first to fourth advantages.

What is claimed is:

1. A method of fabricating a semiconductor device comprising:
    applying a resist comprising a positive resist containing a photosensitizer to an object to be processed;
    exposing the resist with a first light;
    developing the exposed resist to form a resist pattern;
    performing a first bake of the resist pattern;
    irradiating the resist pattern with a second light within a range of photosensitive wavelength of the photosensitizer after the first bake; and
    performing a second bake of the irradiated resist pattern at a temperature not lower than a glass transition temperature of the positive resist containing the photosensitizer after irradiating the resist pattern with the second light.

2. A method of fabricating a semiconductor device according to claim 1, wherein the photosensitizer is a diazonaphthoquinone.

3. A method of fabricating a semiconductor device according to claim 1, wherein the positive resist containing the photosensitizer is a diazonaphthoquinone-novolac resin type of resist, and the photosensitizer is a diazonaphthoquinone.

4. A method of fabricating a semiconductor device comprising:
    applying a resist comprising a positive resist containing a photosensitizer to an object to be processed;
    exposing the resist with a first light;
    developing the exposed resist to form a resist pattern;
    performing a first bake of the resist pattern;
    irradiating the resist pattern with a second light within a range of photosensitive wavelength of the photosensitizer after the first bake;
    performing a second bake of the irradiated resist pattern at a temperature not lower than a glass transition temperature of the positive resist containing the photosensitizer after irradiating the resist pattern with the second light; and
    performing dry etching processing using the resist pattern as a mask.

5. A method of fabricating a semiconductor device according to claim 4, wherein an edge portion of the object to be processed is formed into a tapered shape by the dry etching processing.

6. A method of fabricating a semiconductor device according to claim 5, wherein the photosensitizer is a diazonaphthoquinone.

7. A method of fabricating a semiconductor device according to claim 5, wherein the positive resist containing the photosensitizer is a diazonaphthoquinone-novolac resin type of resist, and the photosensitizer is diazonaphthoquinone.

8. A method of fabricating a semiconductor device according to claim 4, wherein the photosensitizer is a diazonaphthoquinone.

9. A method of fabricating a semiconductor device according to claim 4, wherein the positive resist containing the photosensitizer is a diazonaphthoquinone-novolac resin type of resist, and the photosensitizer is a diazonaphthoquinone.

10. A method of fabricating a semiconductor device comprising:
    applying a resist comprising a positive resist containing a photosensitizer to an object to be processed;
    exposing the resist with a first light;
    developing the exposed resist to form a resist pattern;
    performing a first bake of the resist pattern;
    irradiating the resist pattern with a second light within a range of photosensitive wavelength of the photosensitizer after the first bake;
    performing a second bake of the irradiated resist pattern at a temperature not lower than a glass transition temperature of the positive resist containing the photosensitizer after irradiating the resist pattern with the second light;
    performing dry etching processing using the resist pattern as a mask; and
    removing the resist pattern.

11. A method of fabricating a semiconductor device according to claim 10, wherein an edge portion of the object to be processed is formed into a tapered shape by the dry etching processing.

12. A method of fabricating a semiconductor device according to claim 10, wherein the photosensitizer is a diazonaphthoquinone.

13. A method of fabricating a semiconductor device according to claim 10, wherein the positive resist containing the photosensitizer is a diazonaphthoquinone-novolac resin type of resist, and the photosensitizer is diazonaphthoquinone.

* * * * *